United States Patent [19]
Salmon et al.

[11] Patent Number: 5,406,303
[45] Date of Patent: Apr. 11, 1995

[54] INSTRUMENT DISPLAY METHOD AND SYSTEM FOR PASSENGER VEHICLE

[75] Inventors: Michael E. Salmon, Spartanburg, S.C.; David L. Ehle, Attica; Jeffrey G. Hovis, Lapeer, both of Mich.

[73] Assignee: Nu-Tech and Engineering, Inc., Lapeer, Mich.

[21] Appl. No.: 910,108

[22] PCT Filed: May 11, 1992

[86] PCT No.: PCT/US92/03927

§ 371 Date: Jul. 6, 1992

§ 102(e) Date: Jul. 6, 1992

[87] PCT Pub. No.: WO92/19992

PCT Pub. Date: Nov. 12, 1992

[51] Int. Cl.⁶ .................... G09G 3/00; G01D 11/28
[52] U.S. Cl. ........................... 345/75; 362/26; 362/30; 116/DIG. 36
[58] Field of Search .......... 116/DIG. 36, 288; 362/30, 26, 27, 29; 324/167, 158, 165, 160; 310/67, 49, 49 R, 67 R, 77; 364/550; 345/7, 75, 9

[56] References Cited

U.S. PATENT DOCUMENTS

| | | | |
|---|---|---|---|
| 2,886,911 | 5/1959 | Hardesty | 116/DIG. 36 |
| 3,560,774 | 2/1971 | Reeves | 310/67 |
| 3,561,834 | 2/1971 | Durand | 310/67 |
| 3,636,447 | 1/1972 | Gelenius | . |
| 3,806,744 | 4/1974 | Abraham et al. | 310/49 |
| 3,946,311 | 3/1976 | Baker et al. | . |
| 4,004,546 | 1/1977 | Harland | 116/288 |
| 4,230,984 | 10/1980 | Taylor | 324/167 |
| 4,258,643 | 3/1981 | Ishikawa et al. | 362/26 |
| 4,310,871 | 1/1982 | Adachi | 362/26 |
| 4,355,249 | 10/1982 | Kenwell | 310/49 R |
| 4,578,617 | 3/1986 | Kerr, III et al. | 362/30 |
| 4,609,868 | 9/1986 | Ferrari | 324/158 |
| 4,639,884 | 1/1987 | Sagues | 324/165 |
| 4,771,368 | 9/1988 | Tsukamoto et al. | 362/29 |
| 4,788,497 | 11/1988 | Katsumura | 324/160 |
| 4,837,493 | 6/1989 | Maeno et al. | 310/67 R |
| 4,882,659 | 11/1989 | Gloudemans | 362/30 |
| 4,884,058 | 11/1989 | Ikeda | . |

(List continued on next page.)

OTHER PUBLICATIONS

Research Disclosure Oct. 1989, 30650 Surface Mount Coil Gage Mechanism.

*Primary Examiner*—Alvin E. Oberley
*Assistant Examiner*—Steven J. Saras
*Attorney, Agent, or Firm*—Brooks & Kushman

[57] ABSTRACT

An instrument display method and system for use in a passenger vehicle has a number of advantageous features including particularly novel, compact, inexpensive and inherently stable electric motors. A first motor includes a rotor assembly having a shaft and a cylindrical magnet which is positioned about a stator assembly to rotate thereabout. The shaft extends through a stator of the stator assembly, a vacuum fluorescent display (VFD), and an indicia bearing layer. A mask such as a needle pointer is secured to the shaft of the rotor assembly at the indicia bearing layer to convey the value of instrument data to the passenger. A light emitting panel receives light from the VFD and transmits the light to other positions along the display system where other substantially identical electric motors move their needle pointers to likewise convey additional data to the passenger. The first motor is surface mounted directly on the back of the VFD which has electrical conductors formed therein. The other motors are mounted so that their shafts extend through the optical sheet and the indicia bearing layer. In one embodiment, a light beam projecting mechanism projects light beams modified by the various needle pointers to a reflective surface which, in turn, reflects the modified light beams toward the passenger.

21 Claims, 30 Drawing Sheets

U.S. PATENT DOCUMENTS

| | | | |
|---|---|---|---|
| 4,890,027 | 12/1989 | Bohner et al. | |
| 4,939,675 | 7/1990 | Luitje | 364/550 |
| 4,959,759 | 9/1990 | Kohler | 362/26 |
| 4,972,122 | 11/1990 | Daidouji et al. | 345/7 |
| 4,988,944 | 1/1991 | Ito | |
| 4,991,065 | 2/1991 | Clem | 362/27 |
| 5,003,433 | 3/1991 | Fournier | 362/29 |
| 5,059,956 | 10/1991 | Iino | 345/7 |
| 5,121,018 | 6/1992 | Oldakowski | 310/77 |
| 5,121,099 | 6/1992 | Hegg et al. | 345/9 |
| 5,128,659 | 7/1992 | Roberts | 345/7 |
| 5,136,516 | 8/1992 | Twombly | 345/75 |
| 5,162,789 | 11/1992 | Moriya et al. | 345/75 |
| 5,202,668 | 4/1993 | Nagami | 345/75 |

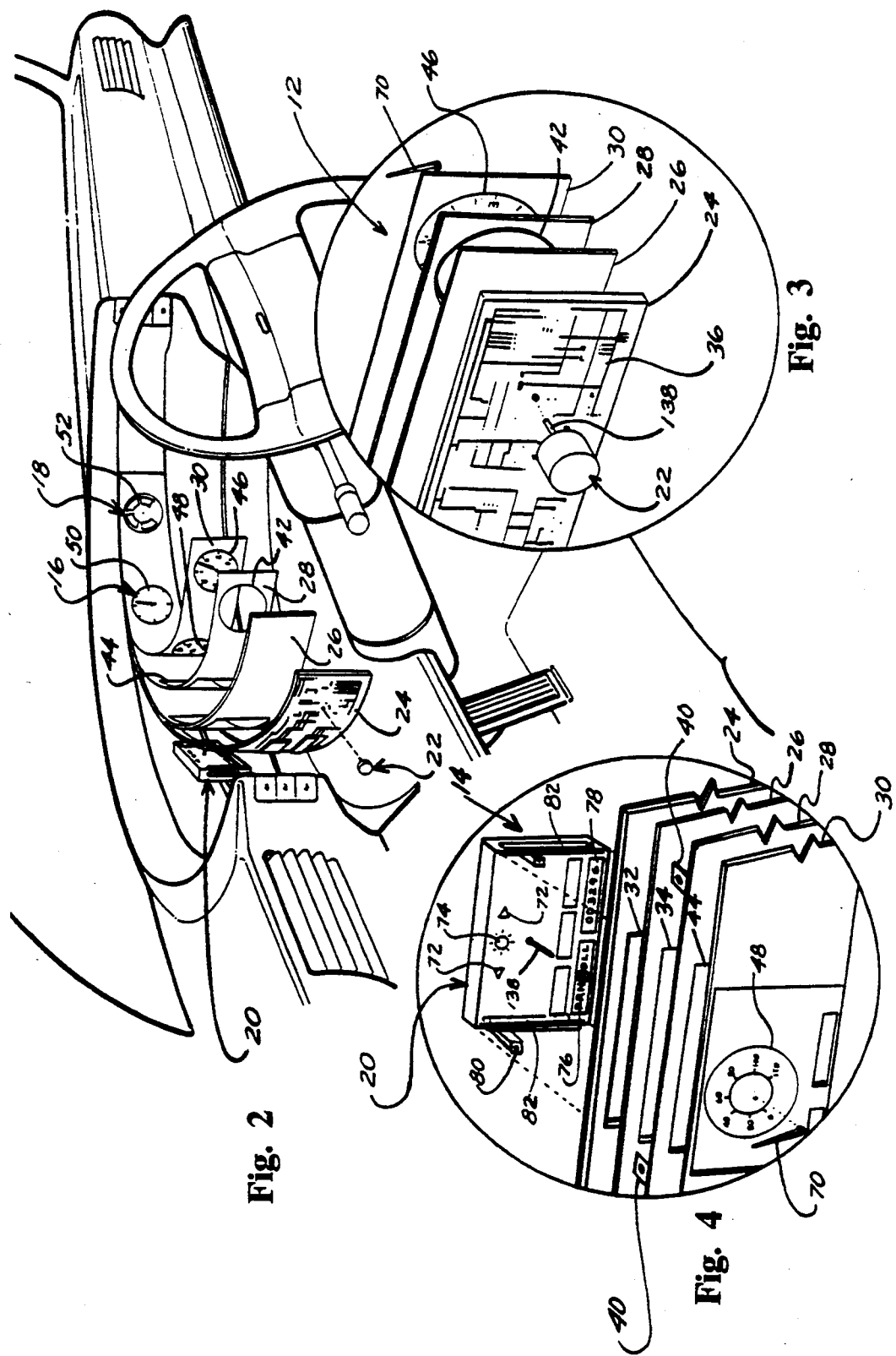

INSTRUMENT DISPLAY METHOD AND SYSTEM FOR PASSENGER VEHICLE

TECHNICAL FIELD

The present invention is related to instrument display methods and systems and, in particular, to conventional and projection-type instrument display methods and systems for passenger vehicles.

BACKGROUND ART

Automotive instrumentation clusters serve the useful function of providing a wealth of information about vehicle operation to the driver. Typically, the cluster provides primary operational information such as vehicle speed, engine speed and temperature, fuel level and oil pressure, in addition to providing secondary operational information regarding vehicle security (door ajar, etc.), use of seat belts, emissions, and the like.

Conventional instrument displays in automobiles are located in an area in front of the driver, below the windshield or windscreen which is normally referred to as the dashboard or instrument panel. As is well known, this arrangement requires drivers wishing to check their current rate of speed to momentarily lower their eyes so that they are focusing on the speedometer on the dashboard and not watching the road.

Prior art instrumentation clusters generally are quite large and bulky and require complex manufacturing equipment and processes. This is due to the size and quantity of hardware typically required for analog and digital instrumentation, such as motors, wiring and lighting.

For example, U.S. Pat. No. 3,636,447, issued to Gelenius, discloses a wide-angle electrical gauge having two coils. The two coils are angularly displaced at 90° to each other. A circuit supplies current as approximate sine and cosine waves to the coils, resulting in a wide-angle displacement of an indicator needle.

U.S. Pat. No. 3,946,311, issued to Baker et al., discloses an air core gauge with an expanded pointer range. Pulse generators control a switching means so as to cause excitation of a plurality of angularly oriented coils. The excitation creates a resultant mmf vector, resulting in the displacement of a magnet and its associated pointer.

U.S. Pat. No. 4,890,027, issued to Bohner et al., discloses a dynamic motor controller for a high-performance, lightweight and low cost motor. The position control of the motor is accomplished by the use of an electronic braking apparatus, which includes a piezoelectric transducer for applying a braking force to the rotor.

U.S. Pat. No. 4,884,058, issued to Ikeda, discloses a combination indicator apparatus for an automotive vehicle. The indicator apparatus includes a plurality of cross-coil (air gauge) movements for use as analog indicators, the movement being driven by a single controller in a time-sharing serial transmission mode of operation.

U.S. Pat. No. 4,988,944, issued to Ito, discloses a cross coil type instrument wherein a plurality of coils are cross-arranged around a rotatable permanent magnet. The instrument further includes a needle secured to the magnet to rotate therewith. Rotation of needle is caused by a generated composite magnetic field.

Air core or cross-coil type gauges thus have distinct sizing, cost and efficiency disadvantages especially when utilized with projection-type instrumentation such as head-up displays (HUD's). These disadvantages are due primarily to the construction and control of the gauges.

For safety reasons and reasons of general convenience, it has been suggested that a head-up type display, similar to those found in fighter aircraft, be used in the environment of an automobile to provide the driver with a means for reading the automotive instrumentation without removing the driver's visual attention from the roadway.

It is considered impractical from the viewpoint of cost, to simply apply aircraft head-up display technology to the environment of an automobile. The cost of such a head-up display would be an appreciable fraction of the normal cost of the automobile. Thus, the benefits to be derived from a head-up display would not justify the cost of installing such a device.

Head-up displays of the type used in military aircraft occupy a substantial volume. A straightforward installation of an aircraft type head-up display would require either a large volume to be placed above the normal line of the automobile hood, or breaking throughout the firewall into the engine compartment in a manner which is deemed to be wholly impractical. Similarly, there is insufficient room between the firewall and the dashboard to allow practical redesign of an otherwise normal passenger automobile to accommodate a conventional head-up display. Thus, application of head-up display technology to the environment of an automobile requires a way to reduce the volume occupied by the display.

In contrast to the aviation setting, the automobile driver requires a relatively small amount of information, in a relatively small angular space, which is comfortably visible without head motion. A practical head-up display for an automobile should provide a fairly compact instrument cluster which is visible from any area in space in which a driver's eyes might be located.

In some ways the environment of a conventional passenger automobile is more harsh on such a display than the environment of a high performance fighter aircraft. In particular, a head-up display is one which includes an optical path from the display source to the combiner which is located at or near the windshield of the vehicle in which the display is installed. While military aircraft are treated with special care while parked on the ground and out of service, it is well known that automobiles are often left standing for extended periods of time in environments which range from extreme cold to extreme heat and sunlight.

The temperature within an automobile parked in the sun on a hot day, can easily exceed 140° F. Furthermore, an optical path from the source, through the exit orifice up to the combiner, normally includes an axis which is substantially perpendicular to the ground. This means that when the sun is overhead, there is a small but finite probability that there may be a direct optical path coupling the sun back to the sources of the display image. This can lead to the focusing of very intense visible and infrared light rays at the display image which may damage the image source or projection. Therefore, heat dissipation at the image source of the display, as well as protection from the sunlight becomes an important factor.

One attempt to surface mount a coil gauge mechanism is disclosed in disclosure number 30650 contained in Research Disclosure, October, 1989. The gauge mechanism consists of surface mount coils and a permanent magnet spindle assembly. Attached to the spindle can be a dial pointer or other indicating device. The coils have a high permeability core and are wound with insulated copper wire for the coil. The rotational position of the spindle assembly permanent magnet is controlled by the amount and direction of electrical current in the surface mount coils. The mechanism is held in place by a bottom self-lubricating bearing and an upper bearing bracket. The upper bearing bracket also serves as a flux-containing package.

SUMMARY OF THE INVENTION

An object of the present invention is to provide in combination with an instrument display system for use in a passenger vehicle, an electric motor which is compact, relatively inexpensive and inherently stable so that the display system is compact.

Another object of the present invention is to provide in combination with an instrument display system for use in a passenger vehicle of the type having a mechanism for projecting a light beam along a light beam path to a viewing position within the passenger's field of view, an electric motor which is compact, relatively inexpensive and efficient.

Still another object of the present invention is to provide in combination with an instrument display system for use in a passenger vehicle of the type having a mechanism for projecting a light beam along a light beam path to a viewing position within the passenger's field of view, an electric motor which is fixedly secured and electrically coupled to the back surface of a back layer of the projecting mechanism wherein a source of light is located on the other side of the back layer.

Yet still another object of the present invention is to provide in combination with an instrument display system for use in a passenger vehicle of the type having a mechanism for projecting a light beam along at least two light beam paths, two viewing positions within the passenger's field of view, an optical sheet which transmits light from a source of light along at least one of the light beam paths to at least one of the viewing positions.

In carrying out the above objects and other objections of the present invention, an instrument display system for use in a passenger vehicle to provide a visual representation of instrument data to the passenger is provided. The system of the type having means for projecting a light beam along a light beam path to a viewing position within the passenger's field of view, a mask or pointer, an electric motor for moving the mask relative to the light beam path and control means for controlling movement of the mask. The electric motor is responsive to the control means and has a stator assembly and a rotor assembly for rotating relative to the stator assembly. The rotor assembly includes a cylindrical magnet which is coupled to the mask to move the mask and positioned about the stator assembly. The moving mask conveys the instrument data to the passenger.

Further, in carrying out the above objects and other objects of the present invention, an instrument display system for use in a passenger vehicle to provide a visual representation of instrument data to the passenger is provided. The system is of the type having a mask, an electric motor for moving the mask relative to the light beam path and control means for controlling movement of the mask. The electric motor is responsive to the control means and has a stator assembly and a rotor assembly for rotating relative to the stator assembly. The rotor assembly includes a cylindrical magnet which is coupled to the mask to move the mask and is positioned about the stator assembly for rotating without the stator assembly to enable the mask to convey the instrument data to the passenger.

Still further in carrying out the above objects and other objects of the present invention, an instrument display system for use in a passenger vehicle to provide a visual representation of instrument data to the passenger is provided. The system is of the type having means for projecting a light beam along a light beam path to a viewing position within the passenger's field of view, a mask, an electric motor for moving the mask relative to the light beam path and control means for controlling movement of the mask. The electric motor is responsive to the control means and is a stator assembly and a rotor assembly for rotating relative to the stator assembly. The rotor assembly includes a magnet which is coupled to the mask to move the mask to enable the mask to selectively modify the light beam along the light beam path. The modified light beam conveys the instrument data to the passenger. The means for projecting includes a front layer through which the light beam is transmitted. A back layer having a back surface and made of an insulating material has electrical conductors formed thereon. The stator assembly is fixedly secured to the back layer and electrically coupled to the electrical conductors. A source of light is disposed between the front and back layers.

Yet still further in carrying out the above objects and other objects of the present invention, an instrument display system for use in a passenger vehicle to provide a visual representation of instrument data to the passenger is provided. The system is of the type having means for projecting a light beam along at least two light beam paths to viewing positions within the passenger's field of view, at least two masks, at least two electric motors for moving their respective masks relative to their respective light beam paths and control means for controlling movement of the masks to enable the masks to selectively modify the light beam along their respective light beam paths. The electric motors are responsive to the control means. Each of the motors has a stator assembly and a rotor assembly for rotating relative to the stator assembly. The means for projecting includes a source of light and an optical sheet adapted to receive light from the source of light for transmitting the received light along at least one of the light beam paths to at least one of the viewing positions within the passenger's field of view. The modified light beam conveys the instrument data to the passenger.

In one embodiment, a reflective surface is located in the passenger's field of view. The reflective surface is adapted to reflect the modified light beam toward the passenger.

In another embodiment, the means for projecting includes a combiner located in the light beam path to project the modified light beam into the passenger's field of view.

The advantages accruing to the system of the present invention are numerous. For example, the motor construction results in a low-cost, efficient and compact motor, resulting in a compact automotive instrument cluster.

The above objects and other objects and features of the invention will be readily appreciated by one of ordinary skill in the art from the following detailed description of the best mode for carrying out the invention when taken in connection with the following drawings.

BRIEF DESCRIPTION OF DRAWINGS

FIG. 2 is a partially-exploded perspective view of the cluster of FIG. 1;

FIG. 3 is an enlarged exploded perspective view, partially broken away, of the various layers comprising a fuel gauge of the cluster;

FIG. 4 is an enlarged partially exploded perspective view of the instrument cluster including a vacuum fluorescent display (VFD) unit and a speed gauge;

BEST MODE FOR CARRYING OUT THE INVENTION

Figure 1:
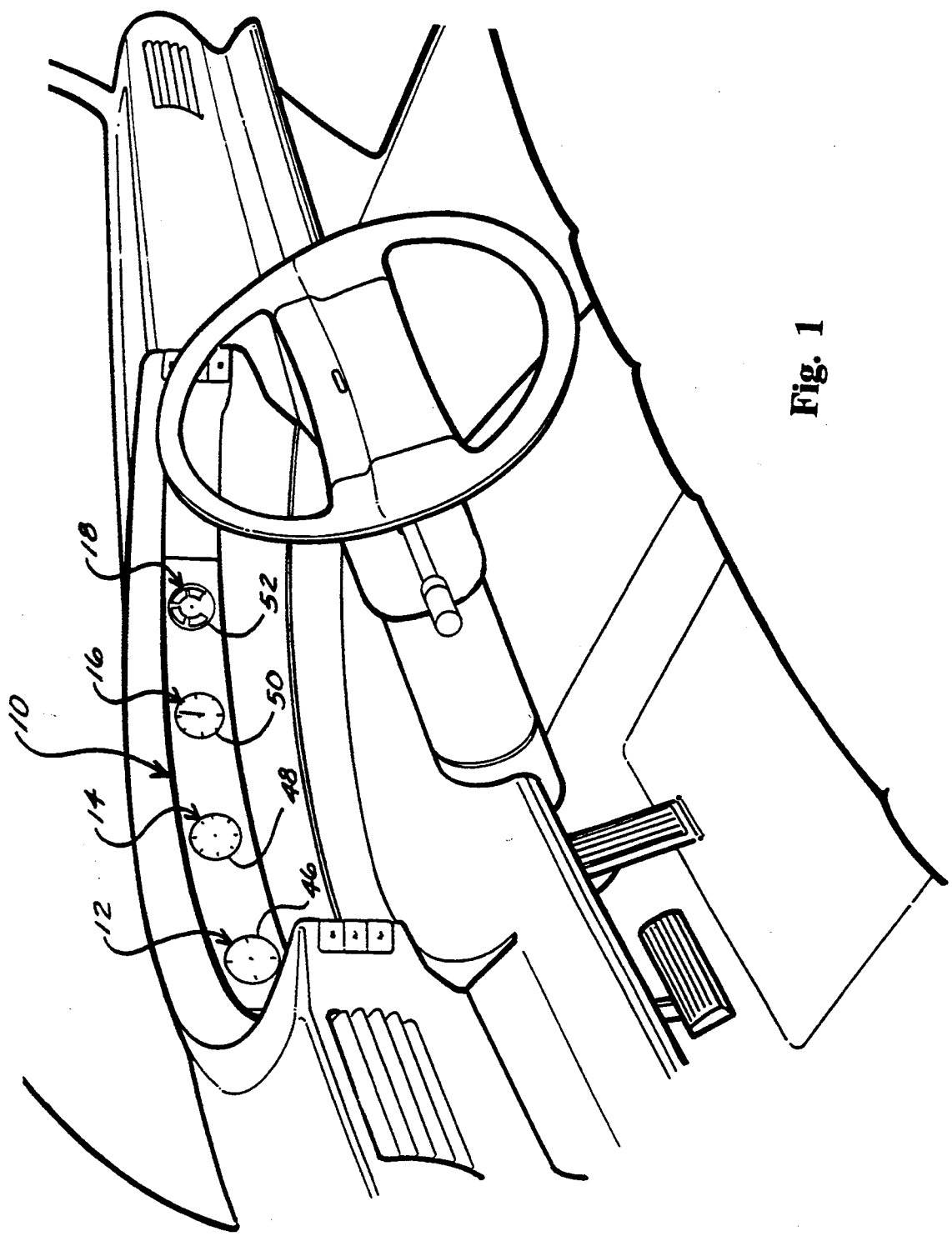
FIG. 1 is a perspective view of one embodiment of an instrument display system or cluster of the present invention within an automobile.

Referring now to FIG. 1, there is illustrated an automobile interior having an instrument cluster or display constructed in accordance with the present invention, generally indicated by reference numeral 10. The cluster 10 has a fuel gauge, generally indicated at 12, a vehicle speed gauge (speedometer), generally indicated at 14, an engine speed gauge (tachometer), generally indicated at 16 and telltale fault gauge, generally indicated at 18. Although shown to have four gauges, it should be appreciated that the cluster 10 could support any number of gauges.

Turning now to FIG. 2, the cluster 10 is shown to be a multi-layer cluster utilizing a vacuum fluorescent display unit, generally indicated at 20, and a plurality of motors (only one of which is generally indicated at 22).

In the preferred embodiment, the cluster 10 includes a circuit substrate layer 24, a fiber optic or other type layer 26, a support layer 28 and a graphics layer 30. The layers are preferably affixed to each other by commercially available adhesives compatible with the material of the various layers 24 through 30.

The cooperation of the layers 24, 26, 28 and 30 to form the fuel gauge 12 of cluster 10 is shown in greater detail in FIG. 3. The circuit layer 24 is preferably made of a thin, flexible insulating material such as circuit board and is capable of supporting a plurality of conductive electrical traces or leads 36.

The circuit layer 24 is also capable of supporting both surface-mountable and thru-hole electrical and electromechanical components not specifically illustrated. The electrical traces 36 conduct electrical signals to the motor 22, which is mounted on the back of circuit layer 24, as described in greater detail hereinbelow.

The fiber optic layer 26 is preferably positioned in front of the circuit layer 24. The fiber optic layer 26 is preferably a light emitting panel such as that shown in U.S. Pat. Nos. 4,885,663 and 4,907,132, issued to Parker, and is comprised of a plurality of bent optical fibers. Each optical fiber, as is known, serves as a means of transmitting light from a light source. If an optical fiber is maintained axially, i.e., kept substantially straight, then light transmission therethrough is highly efficient.

The optical fibers of the layer 26, however, are woven into a fine-mesh grid. Since the fibers are woven, each fiber has a plurality of bends disposed throughout. This construction permits the light being transmitted through the optical fibers to "leak" out at the bends. The fiber optic layer 26 thus provides a substantially planar light distribution means.

The support layer 28 is optional. The layer 28 could be positioned behind the layer 26 to act as a reflector. The layer 28 is apertured and is preferably positioned in front of the fiber optic layer 26 for supporting the cluster 10. The support layer 28 is preferably made of a lightweight but rigid metal or plastic. As shown in FIG. 4, the support layer 28 has tabs 40 for affixing the cluster 10 to the dashboard. The support layer 28 has holes 42 extending therethrough for the gauges 12 through 18.

The graphics layer 30 is positioned in front of the support layer 28. The graphics layer 30 is preferably made of a flexible plastic material and comprises a fuel graphic disk 46, a speedometer graphic disk 48, a tachometer graphic disk 50 and a fault graphic disk 52.

The graphic disks or masks 46, 48, 50 and 52 are preferably transparent and have indicia imprinted thereon. The nature of the indicia depends, of course, on the gauge with which the disk will be utilized. For example, the speedometer graphic disk 48 has numeric indicia (e.g. 10, 20, etc.) depicting vehicle speeds while the fuel graphic disk 46 has alphanumeric indicia (e.g. F, ½, E) depicting various fuel levels.

The VFD unit 20 is shown in greater detail in FIG. 4. The VFD unit 20 utilizes a conventional VFD as the light source for the cluster 10 such as the VFD of FIG. 5a and the unit 20 has mounting tabs 80 for securing the unit 20 to the support layer 28.

Figure 5A:
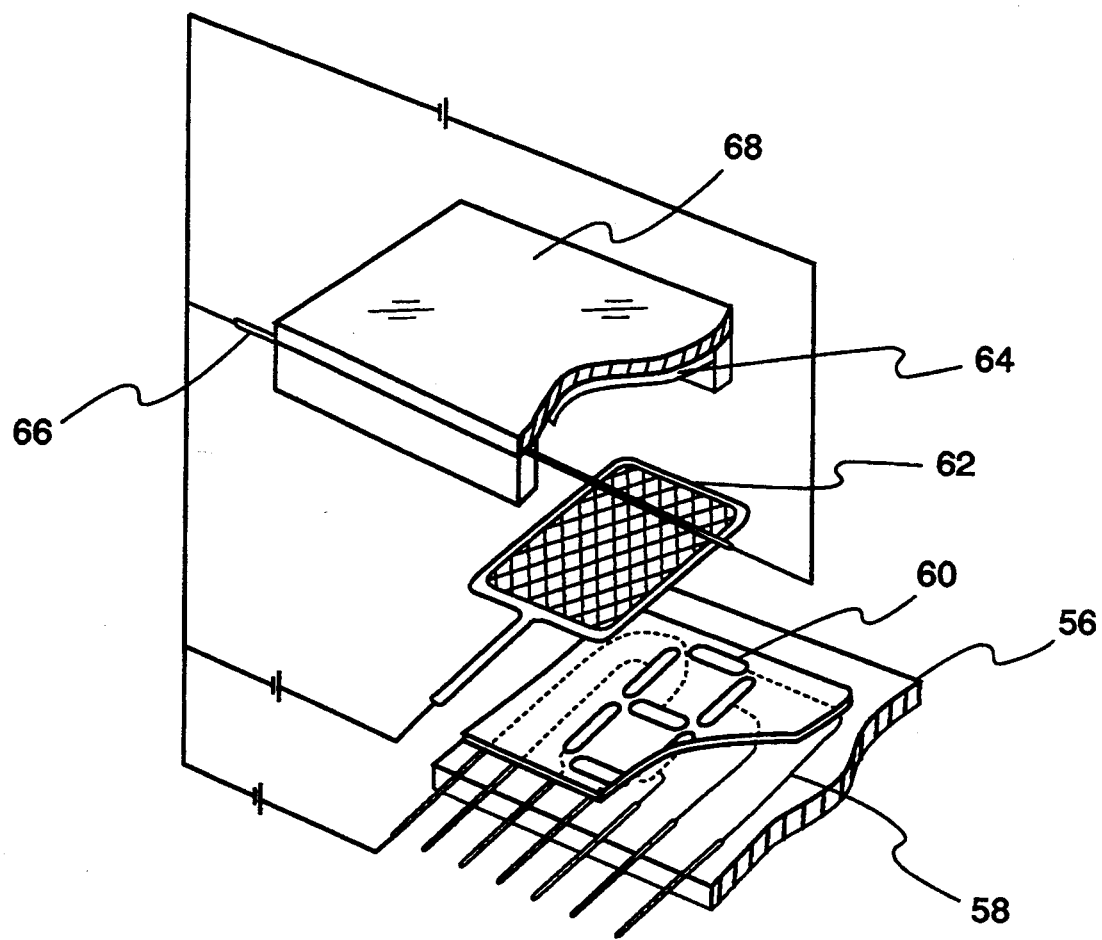
FIG. 5a is an exploded view of the structure of a basic VFD.

As illustrated in FIG. 5a, the VFD has a substrate 56 which supports electrical traces 58 and a grid 62. Phosphor coated anode segments 60 define the object to be projected and are positioned between the substrate 56 and the grid 62. A transparent conductive film 64 having a filament cathode 66 is positioned over the grid 62. Finally, a layer of transparent glass 68 is placed on top of the film 64 for protection. When the VFD is energized, the appropriate phosphor coated segments 60 become illuminated and the desired image is projected through the glass 68.

Returning again to FIG. 4, the VFD unit 20 is positioned within a hole 32 in the circuit layer 24 and aligned with hole 34 in the fiber optic layer 26. In addition to projecting a light beam through an aligned hole 44 in the support layer 28 for the speedometer 14, the VFD unit 20 also projects a light beam for turn signal indicators 72, a high-beam headlight indicator 74, a "PRNDL" indicator 76 and a digital odometer 78.

The VFD unit 20 also supplies light to the fiber optic layer 26 through a plurality of light apertures 82, which are located on opposite sides of the VFD unit 20. Obviously, only one such aperture 82 could be provided. When the VFD unit 20 is positioned within the hole 34, the light apertures 82 are in close proximity to the fiber optic layer 26.

The light transmitted through the two light apertures 82 is then distributed in a planar fashion throughout the fiber optic layer 26, as described in greater detail above. The light from the fiber optic layer 26 then passes through the holes 42 in the support layer 28 and through the graphics disks 46, 50 and 52, thereby illuminating the fuel gauge 12, the tachometer 16 and the fault gauge 18, respectively.

Each gauge of the cluster 10 includes an electric motor 22 which is generally characterized as a brushless DC motor. For the fuel gauge 12, the tachometer 16 and the fault gauge 18, the motor 22 is mounted directly on the back of circuit layer 24. Alternately, the motor 22 could be mounted on the front.

As shown in FIG. 3, an output shaft 138 of motor 22 extends through the layers 24, 26, 28 and 30 and, in the preferred embodiment, a mask such as needle pointer 70 is fixedly attached to the end of the output shaft 138 proximate the front of the graphics layer 30 to rotate therewith.

For the speedometer 14, the motor 22 is mounted directly on the back of the substrate 56 of the VFD unit 20. As shown in FIG. 4, the output shaft 138 of motor 22 extends through the VFD unit 20 and the layers 26 through 30. A glass or plastic pipe (not shown) extends between the substrate 56 and the glass 68 to not only seal the VFD, but also to rotatably support the shaft 138 on the VFD. Another needle pointer 70 is also affixed to the end of the output shaft 138 proximate the front of the graphics layer 30 to rotate therewith.

It is to be appreciated that one or more of the needle pointers 70 could be simulated utilizing a mask disc having a pointer-shaped slit removed from its face. This would have the effect of permitting the light beam from the fiber optic layer 26 to leak through the slit, thereby providing an illuminated "pointer" on the face of its respective graphics disk.

Figure 5B:
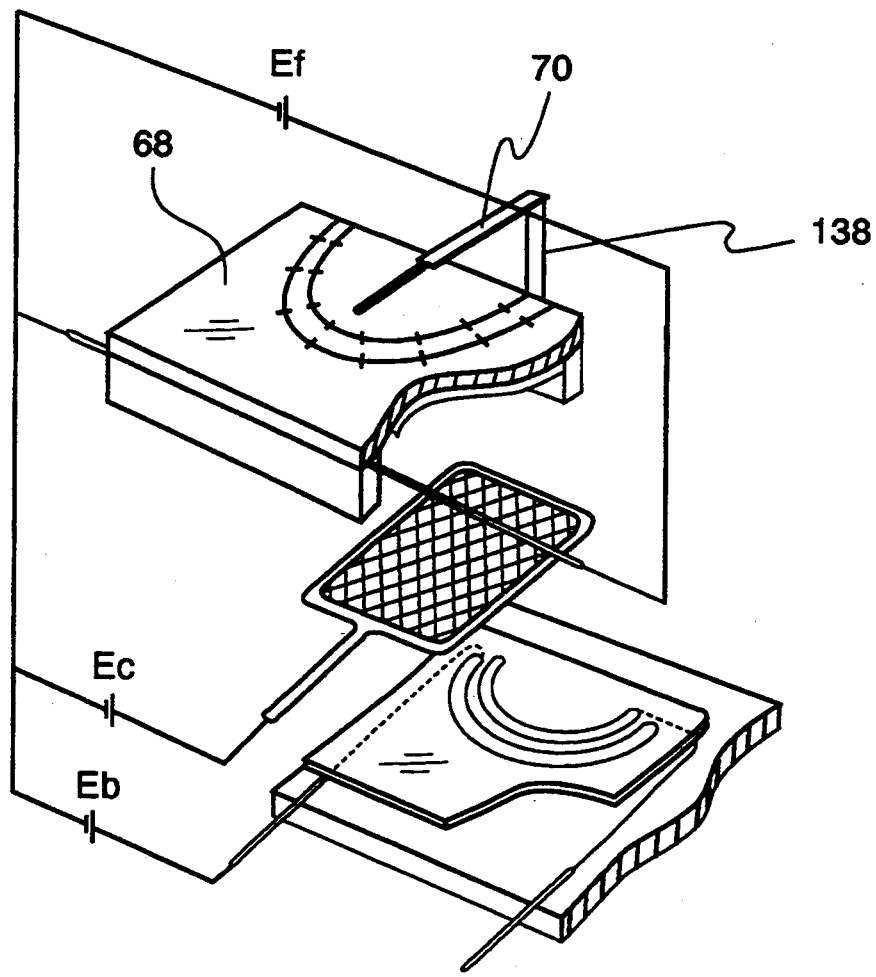
FIG. 5b is a view similar to FIG. 5a illustrating a modified VFD unit and a pointer.

It should also be appreciated that the numeric indicia for one or more of the shapes could be imprinted as a layer directly on the layer of glass 68 (i.e. the face) of the VFD unit 20, as shown in FIG. 5b. In this embodiment, the motor could be positioned so that the output shaft 138 extends along a side, instead of through, the VFD unit. The pointer 70 is then attached to the output shaft 138 to "hang" over the glass 68.

Figure 6:
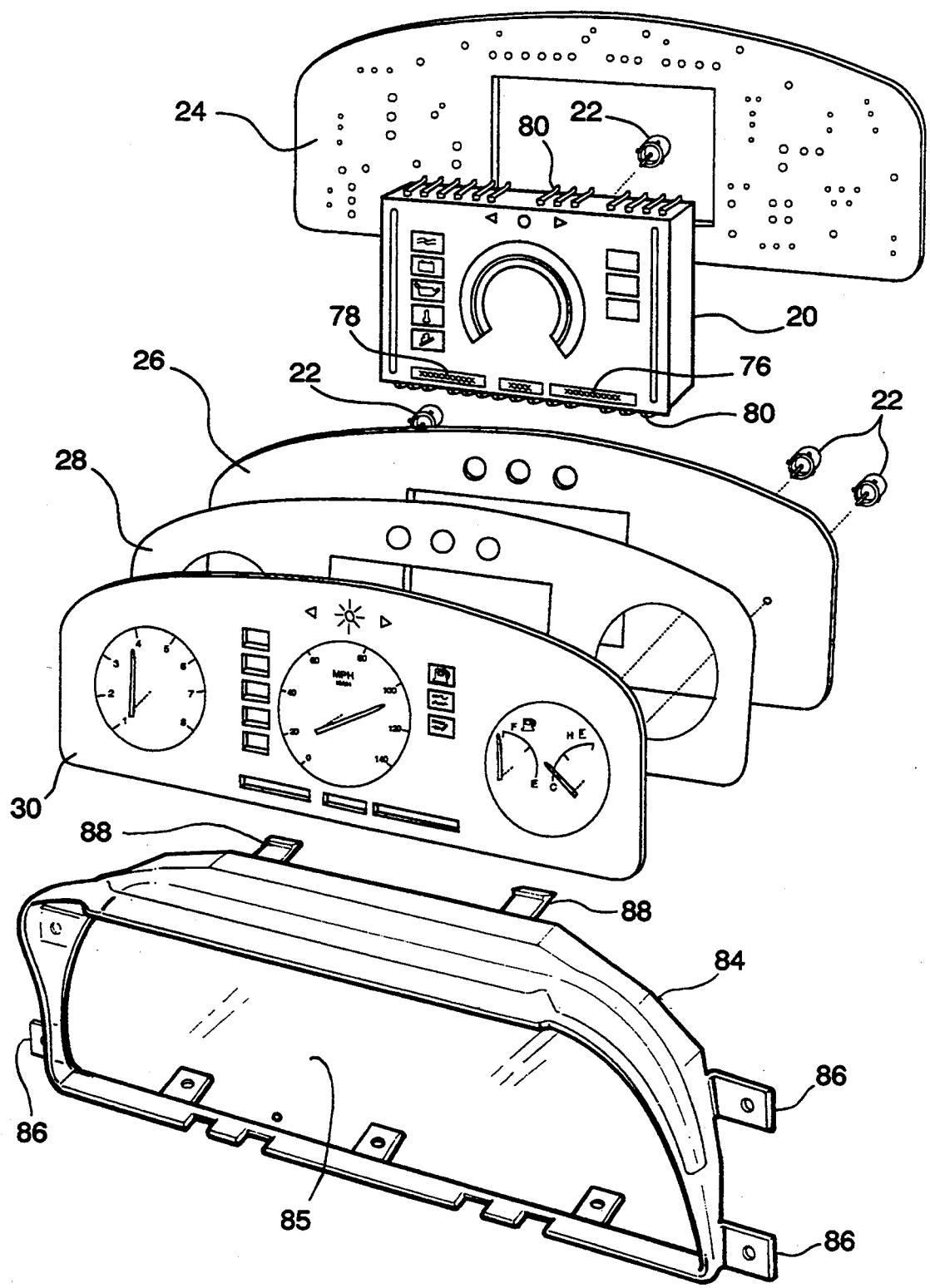
FIG. 6 is an exploded perspective view of another embodiment of an instrument cluster constructed in accordance with the present invention.

An exploded perspective view of another embodiment of an instrument cluster in shown in FIG. 6. In this embodiment, the layers 24 through 30 are affixed together as described above in cooperation with the plurality of motors 22 and the VFD unit 20 and received and retained within the cluster shell 84.

The cluster shell 84, as is shown, is preferably made of a plastic material and has a clear plastic front panel 85 and a plurality of mounting tabs 86 and mounting clips 88. When fully assembled with the layers 24 through 30, the cluster shell 84 can be quickly secured and mounted to the dashboard from the front or back side, thereby easing the manufacturing process.

The layer 26 overlays the apertures 82 so that light from the unit 20 is normal to the layer 26. The layer 26 receives and transmits a percentage of such light along its length. A higher percentage of such light can be transmitted if the front surface of the layer 26 has a reflective surface formed thereon wherein the light not absorbed by the layer 26 initially is reflected back into the unit 20. This reflected light then later again strikes the layer 26 and the same percentage is again absorbed. In this way a much greater percentage of light can be absorbed by the layer 26.

As indicated in FIG. 6, the VFD unit 20 may include graphics formed in or printed on the VFD unit 20 or may be part of the graphic layer 30.

Alternatively, a prism can bend the light from the unit 20 to the layer 26 so no overlap is necessary. Also, the light from the unit 20 can be emitted at transparent side panels as in the embodiment of FIG. 4. The layer 26 could also be bent at its inner edges.

Figure 7A:
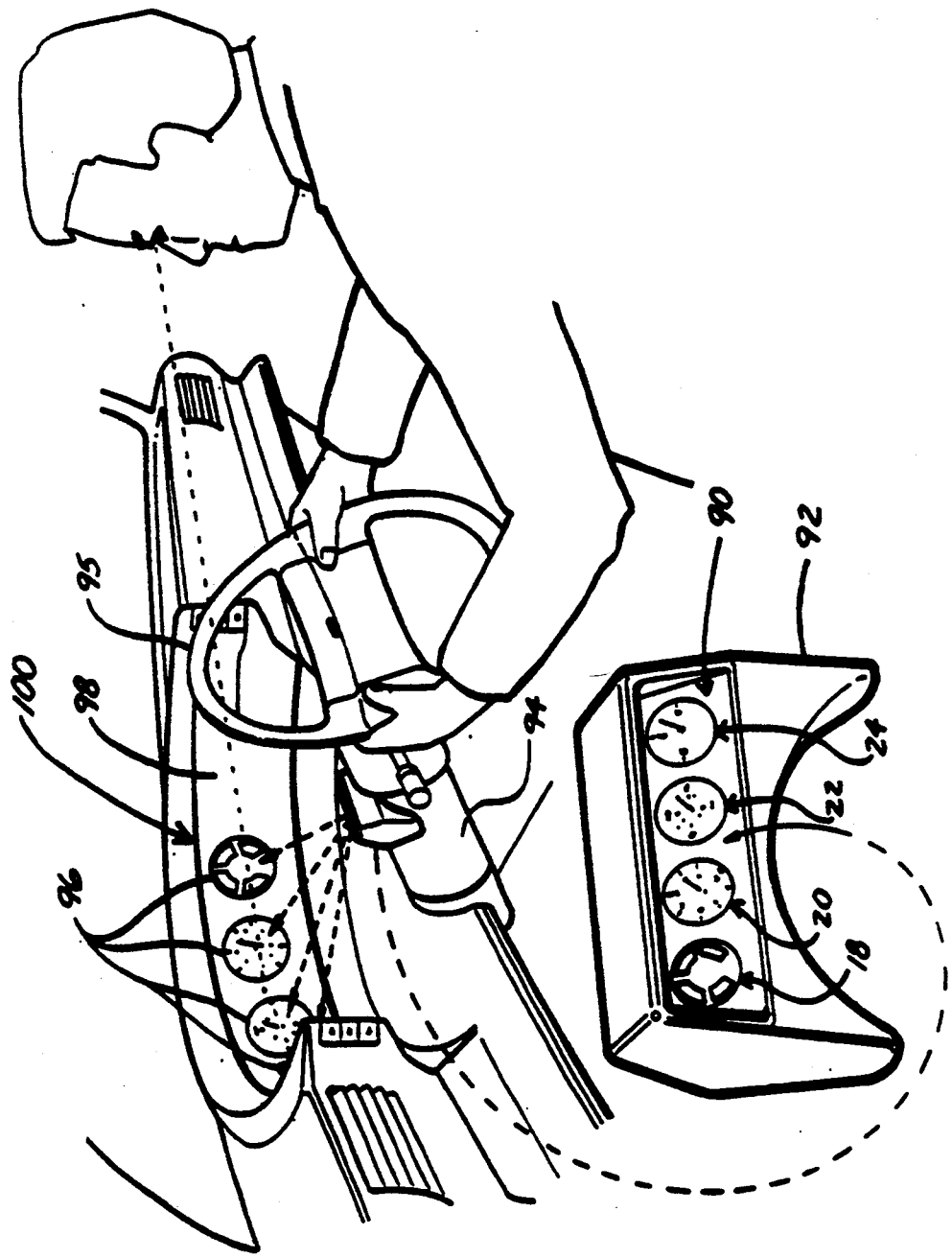
FIG. 7a is a perspective view of a second embodiment of an instrument display system or cluster of the present invention illustrated as a projection-type instrument cluster within an automobile including its driver.

Referring now to FIG. 7a, there is shown a first embodiment of a projection-type instrument cluster, generally indicated at 90. The instrument cluster 90 is substantially similar to the structure and function of instrument cluster 10 described in greater detail above, with the exceptions as noted hereinbelow.

The instrument cluster 90 is contained within a projection unit 92. In the preferred embodiment, the projection unit 92 is designed to be fixedly mounted on a steering column 94 of a steering wheel 95.

The instrument cluster 90 also preferably employs a VFD unit and fiber optic layer as the light source. In this embodiment, however, images 96 of the gauges 18 through 24 are projected onto a panel 98 having a reflective front surface within the field of view of the operator of the vehicle and could appear to be deep within the dash. The panel 98 is provided on a dashboard, generally indicated at 100.

The reflective surface of the panel 98 reflects the projected image of the gauges 96 to the vehicle operator or passenger to thereby provide a visual representation of the data on the gauges. Due to the possibility of distortion, the display unit 92 is mounted so as to be unsusceptible to vibrations relative to the dashboard 100.

Figure 7B:
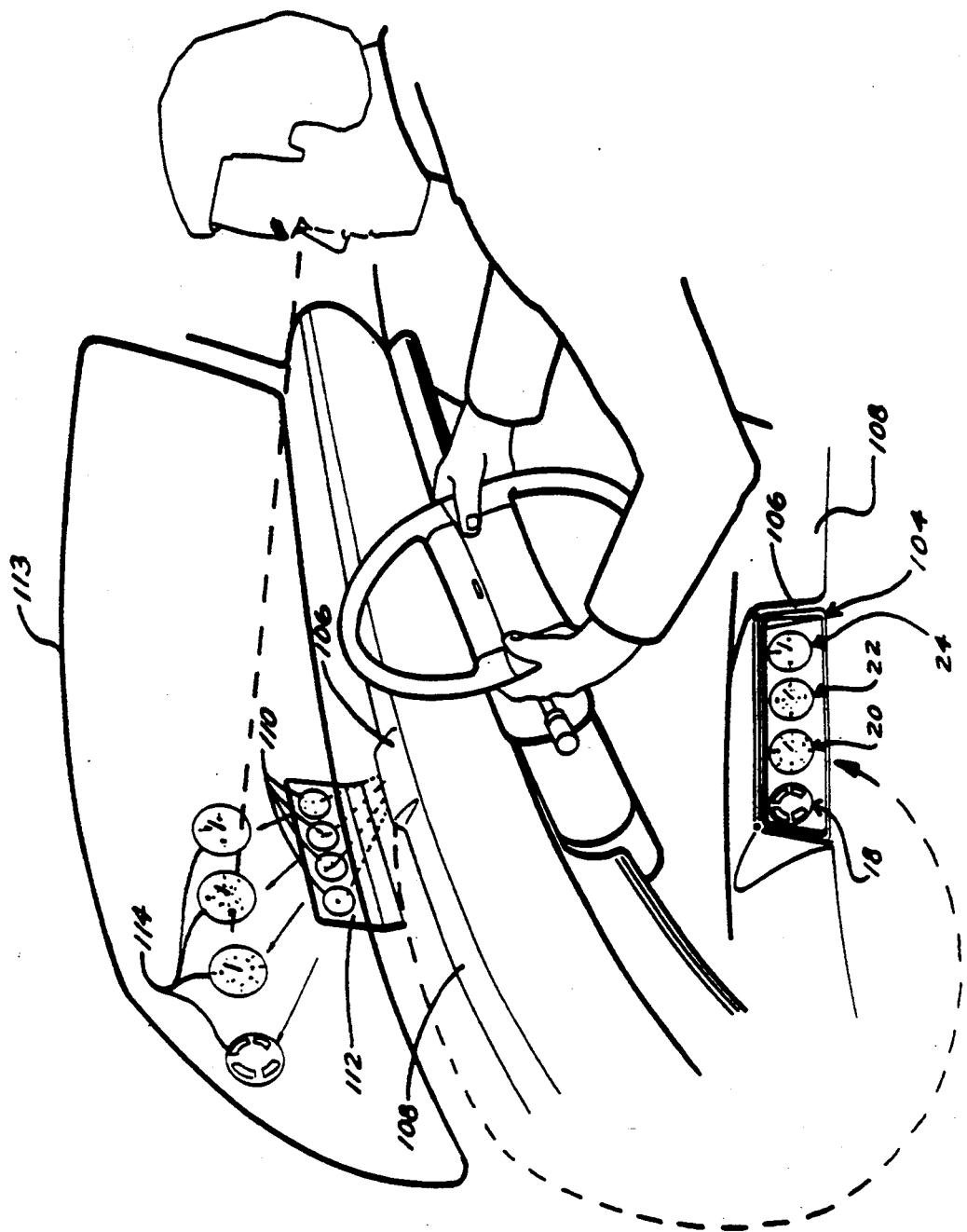
FIG. 7b is a perspective view of a third embodiment of an instrument display system or cluster of the present invention illustrated as a head-up display instrument cluster within an automobile including its driver.

An alternative projection-type instrument cluster, for use in a head-up display (HUD) system, is generally indicated at 104 in FIG. 7b. The instrument cluster 104 is contained within a display unit 106, which, in turn, is fixedly mounted on a dashboard 108. The instrument cluster 104 is substantially the same as the instrument cluster 90 of FIG. 7a.

Images 110 of the gauges 18 through 24 are projected onto a conventional combiner 112 which is typically a planar or spherical sheet of glass that is fixedly mounted to the dashboard 108 so as to be unsusceptible to vibrations. Preferably, combiner 112 will be spherical providing a two to three power magnification. Magnification, however, will vary depending upon the distance between the HUD and the combiner and the desired location of the projected image in front of the vehicle. Combiner 112 is preferably formed of photochromic plastic and coated with a reflective film providing approximately 30% reflectance. Ideally, the reflective film is formed of a scratch resistant metal layer such as titanium oxide or chrome oxide. Photochromic plastic is used to improve image visibility in bright sunlight without hindering nighttime performance.

It is to be appreciated that since the combiner 112 is planar, there is no "ghosting" of the images 110. "Ghosting", as is known, results when images are projected onto a windshield 113 alone. Since there are two reflective surfaces of the windshield 113, two images are reflected back to the vehicle operator. When the combiner 112 is utilized, the reflected image of a gauge is a straight circular image—just as if the operator were looking at a conventional gauge.

When the images 110 of the gauges 18 through 22 are projected onto the combiner 112, virtual images 114 of the gauges 110 appears in front of the vehicle. The virtual images 114 appears generally in the vehicle operator's field of view and the operator does not have to take his eyes off of the road to read the gauges 18 through 24.

Figure 7C:
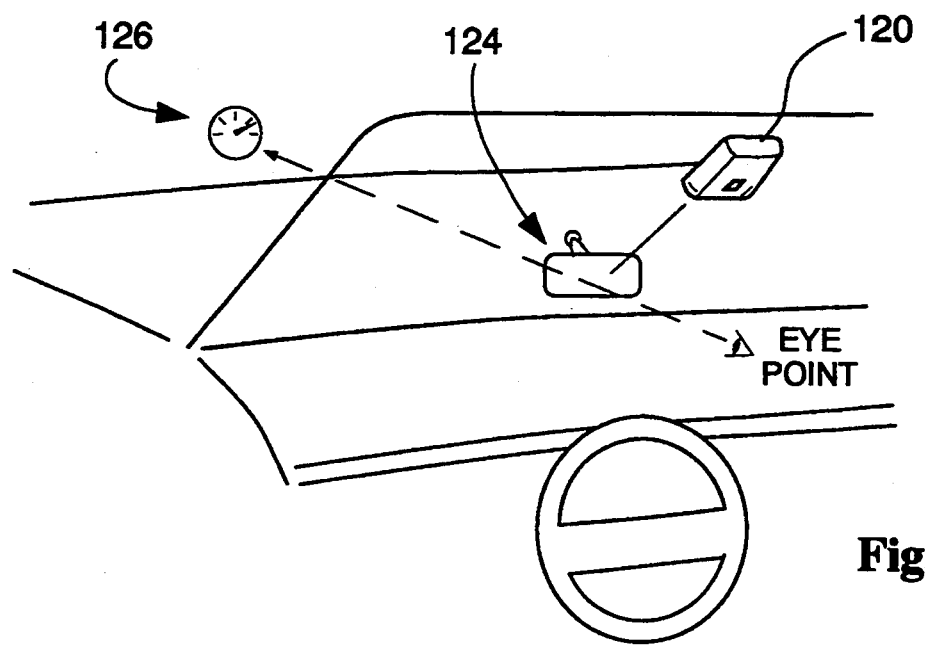
FIG. 7c is a perspective view of a fourth embodiment of the instrument display system or cluster of the present invention illustrated as a projection type HUD instrument cluster mounted upon the windshield.

An alternative HUD instrument cluster, 120 is illustrated in FIG. 7c. Instrument cluster 120 is mounted directly to the upper edge region of the automobile windshield and projects light on to a spherical combiner 124 which is also attached to the windshield. Preferably, spherical combiner 124 is attached to the windshield utilizing an adjustable swivel joint to enable the driver to easily adjust the combiner orientation. This adjustment is need to accommodate variations in the location of the driver's eye point due to different driver heights and seating conditions. The driver will look through the combiner and view a projected image 126 which will appear to be over the automobile hood. By mounting the HUD instrument cluster 120 and combiner 124 directly to the windshield, relative vibration can be minimized.

Figure 7D:
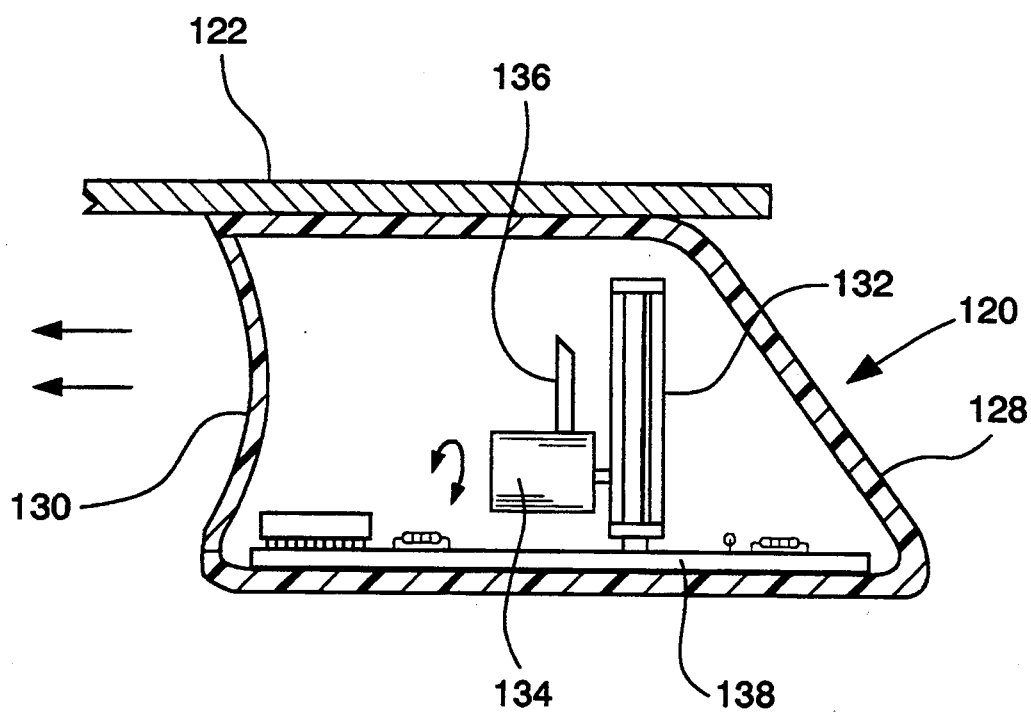
FIG. 7d is a cross-section side elevational view of the HUD instrument cluster illustrated in FIG. 7c.

A cross-sectional side elevation of HUD instrument cluster 120 is illustrated in FIG. 7d. Instrument cluster 120 is made up of a housing 128 which is mounted directly to windshield 122 using a conventional adhesive. Housing 128 has an open window 130 in the front portion thereof through which a light image is projected on to the combiner. Within housing 128 is a vacuum fluorescent display 132 and a miniature motor 134 which drives pointer 136. Both vacuum fluorescent display 132 and motor 134 are mounted on a circuit board 138 as illustrated in FIG. 7d. In the embodiment illustrated, the miniature motor 134 is mounted in front of the vacuum fluorescent display. This enables a conventional vacuum fluorescent display to be used with internal graphics to minimize overall size of the unit.

The motor used in the HUD must be very small in diameter so as to not obscure the image. It is particularly important to utilize a small diameter motor when an instrument cluster will have a plurality of analog gauges. Since the spherical combiner will magnify the size of the projected image viewed by the driver, the size of the HUD instrument cluster must be maintained small so that the projected image does not become too large.

FIG. 8a through 8d illustrate a series of instrument clusters which can be alternatively installed in an automobile instrument panel. These four clusters have significantly different degrees of cost and complexity. All four of these instrument clusters can be made to fit interchangeably within a relatively small cavity in the instrument panel having a total depth 3 to 4 cm.

Figure 8A:
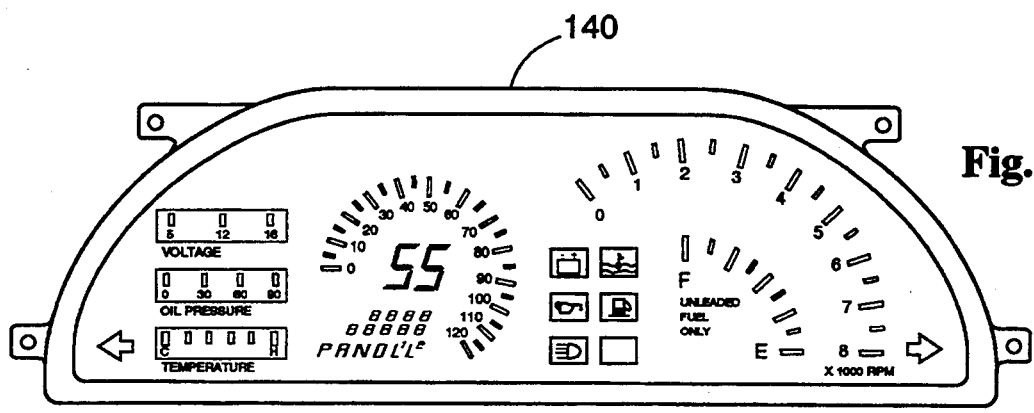
FIGS. 8a through 8d are a series of instrument clusters all sized to interchangeably fit within an automobile instrument panel.
Figure 8B:
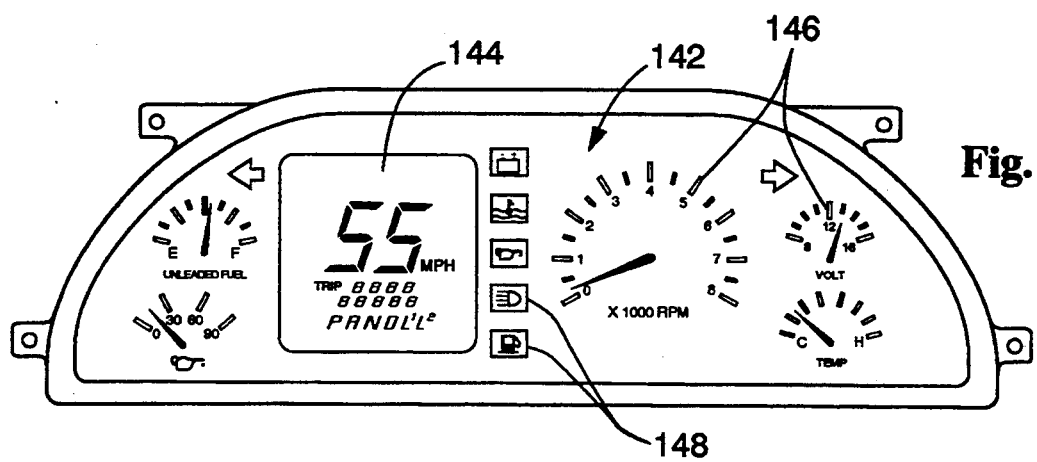

FIG. 8a illustrates what is currently accepted as the state of the art and most expensive instrument cluster 140 available which utilizes a full size custom vacuum fluorescent display providing digital speed and simulated analog gauges. Within the same space required for expensive cluster 140, an automobile manufacturer utilizing the present invention can offer a series of much less expensive clusters shown in FIGS. 8b–c. FIG. 8b illustrates an instrument cluster 142 which is a relatively small vacuum fluorescent display which provides a digital speedometer 144 with the remainder of the gauge functions provided by analog gauges 146 or telltales 148. This hybrid instrument cluster provides almost all of the advantages of the fully digital instrument cluster 140 with the much lower cost due to the use of the small inexpensive vacuum fluorescent display. A very thin instrument cluster can be achieved utilizing miniature motors and a light distribution panel system of the present invention.

Figure 8C:
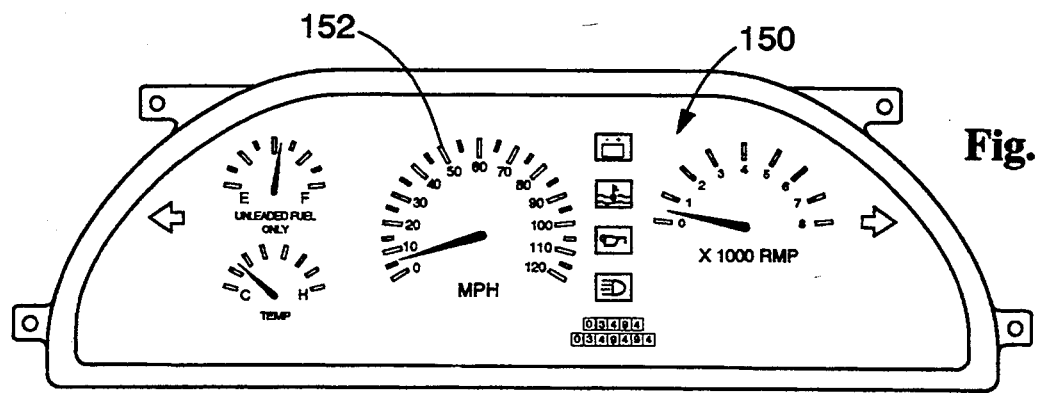
Figure 8D:
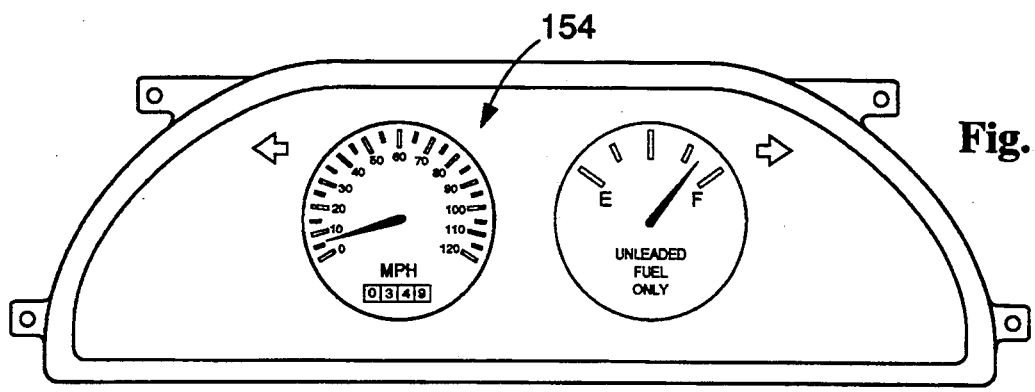

Instrument cluster 150 illustrated in FIG. 8c has a combination of analog gauges and telltales. A central vacuum fluorescent display can be utilized to provide light to the telltales and to illuminate a light distribution panel. The vacuum fluorescent display can be rather small since the vehicle speed is provided by analog gauge 152.

The lowest cost instrument cluster 154 of the series is illustrated in 8d. This low cost panel again uses a light distribution panel powered by vacuum fluorescent display and two miniature motors to provide a very thin low cost instrument cluster which is completely interchangeable with any of the more expensive instrument clusters illustrated in 8a–8c. By utilizing instrument clusters of the present invention, automobile designers can budget less space for an instrument cluster while enabling various cost clusters to be interchangeably installed in vehicle instrument panels.

Figure 9A:
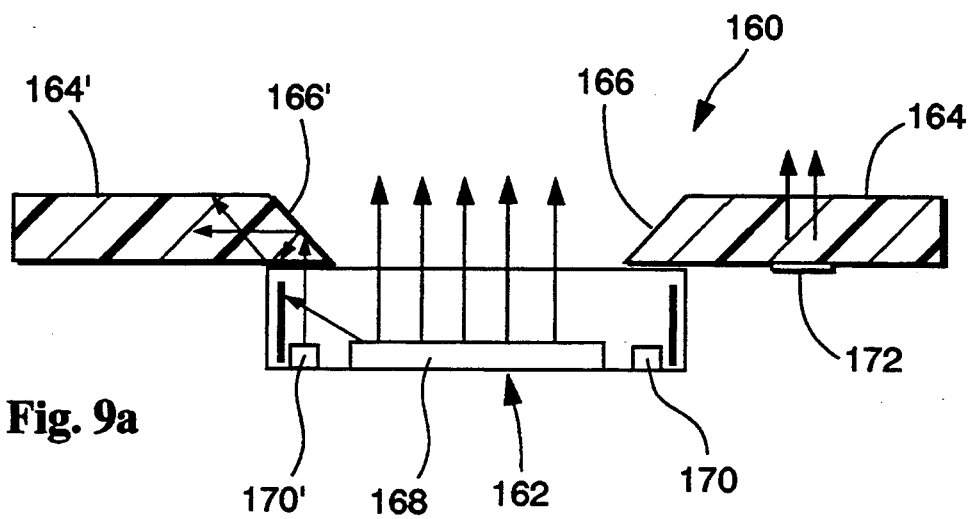
FIGS. 9a through 9c are enlarged cross-sectional views of three alternative vacuum florescent display light distribution panel assemblies.
Figure 9B:
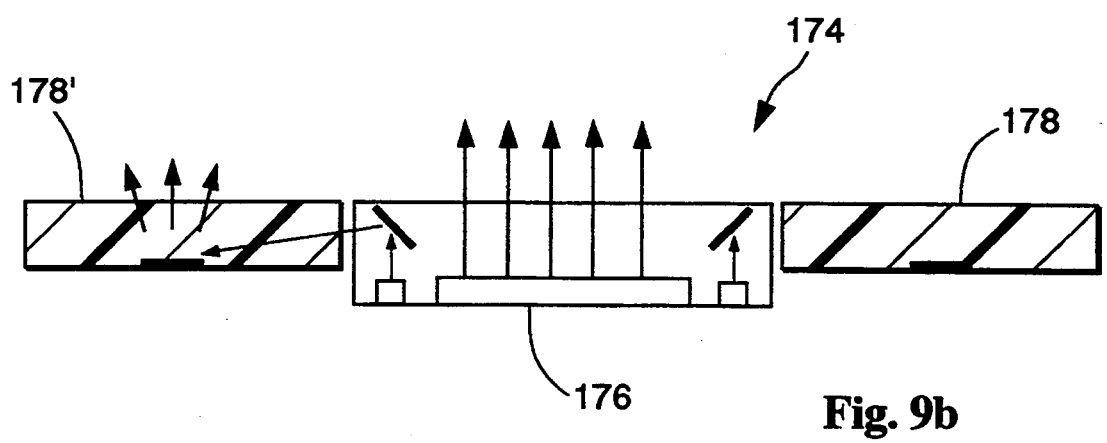
Figure 9C:
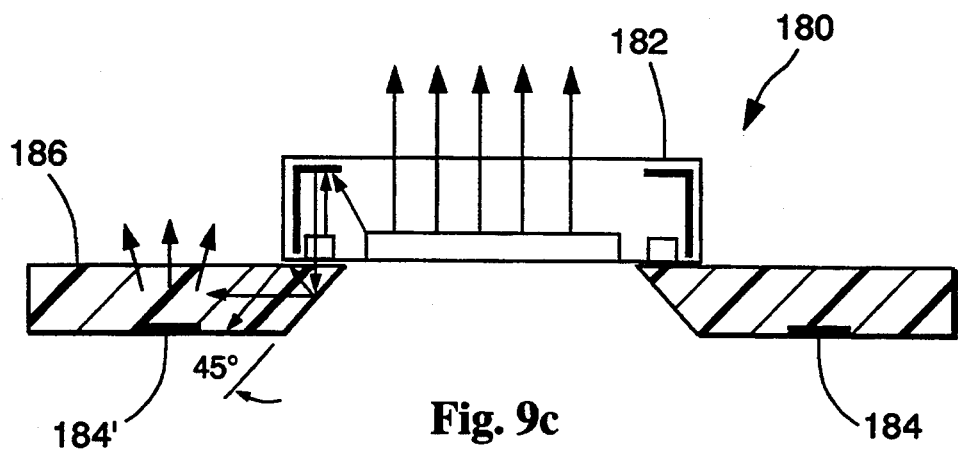

FIGS. 9a–9c illustrate three different embodiments of an instrument cluster illumination system. Illumination system 160 of FIG. 9a, is made up of a vacuum fluorescent display 162 and a pair of illumination panels 164 and 164' on opposite sides thereof. Illumination panels 164 and 164' are preferably acrylic plastic or glass. The Illumination panels are placed on top of the vacuum fluorescent display as shown to overlap the edges of the vacuum fluorescent display. The illumination panels have beveled edge portions 166 and 166' which are coated with a reflective mirror surface in order to reflect light provided by the vacuum fluorescent display into the plane of the illumination panel.

The vacuum fluorescent display 162 is provided with a central illuminescent region 168 which can be directly viewed by the driver to provide digital speed indication or the like as illustrated in instrument cluster 142 shown FIG. 9c. The illumination panel 164 and 164' will provide light to the analog gauges as well as some of the telltales in the remainder of the instrument panel. Vacuum fluorescent display 162 will have a pair of illuminescent regions 170 and 170' oriented below edge portions 166 and 166'. Preferably, illuminescent regions 170 and 170' are made up of a series of segments which are independently illuminatable so that telltale functions and/or turn signal functions can be provided in addition to generally illuminating the majority of the panel.

When the illumination panel 164 and 164' are illuminated, due to the difference in the refractive index of the illumination panel material and air, relatively little light leaks through the face of the panels. In the region where light is needed to illuminate an analog gauge, the back side of the panel is etched or painted with a white paint in order to cause light to reflect out the panel face. Alternatively, the front layer of the panel can be etched or coated with a transparent material having a refracted index sufficient to facilitate escape of light.

The application of paint 172 to the rear of the panel works quite satisfactorily to cause light to locally escape from the corresponding face of the panel. In order to minimize leakage of light around the periphery of the light distribution panels, the marginal edges are preferably coated with a reflective material, such as by metallic foil or the like. Ideally, the foil will be attached by using a solvent to form an in situ weld so that there will not be light loss due to absorption of light by an adhesive layer.

FIG. 9b illustrates an illumination system 174 which operates very similar to illumination system 160 described previously. Illumination system 174 is made up of a vacuum fluorescent display 176 and a pair of acrylic illumination panels 178 and 178'. The vacuum fluorescent display 176 is designed to pass light out of its marginal edges as illustrated thereby enabling illumination panels 178 and 178' to be mounted flush with the face of the vacuum fluorescent display 176 as shown. Internal mirrors or reflectors are provided within the vacuum fluorescent display above the illuminescent strips to direct light transversely out of the vacuum fluorescent display into the illumination panels.

Illumination system 180 illustrated in FIG. 9c is made up of an illuminent vacuum fluorescent display 182 and a pair of acrylic illumination panels 184 and 184'. Illumination system 180 functions substantially similar to illumination system 160 shown in FIG. 9a, however, the vacuum fluorescent display is mounted in front of the light distribution panel. This configuration is particularly suitable for applications where the electric motors driving the pointers are mounted on the front of the panel. The illumination system 160 illustrated in FIG. 9a is particularly suited for mounting of the miniature electric motors driving analog pointers behind the panel. The illumination panels 184 and 184' have reflectors 186 mounted about the panel periphery to manage the light distribution as described previously.

Figure 10A:
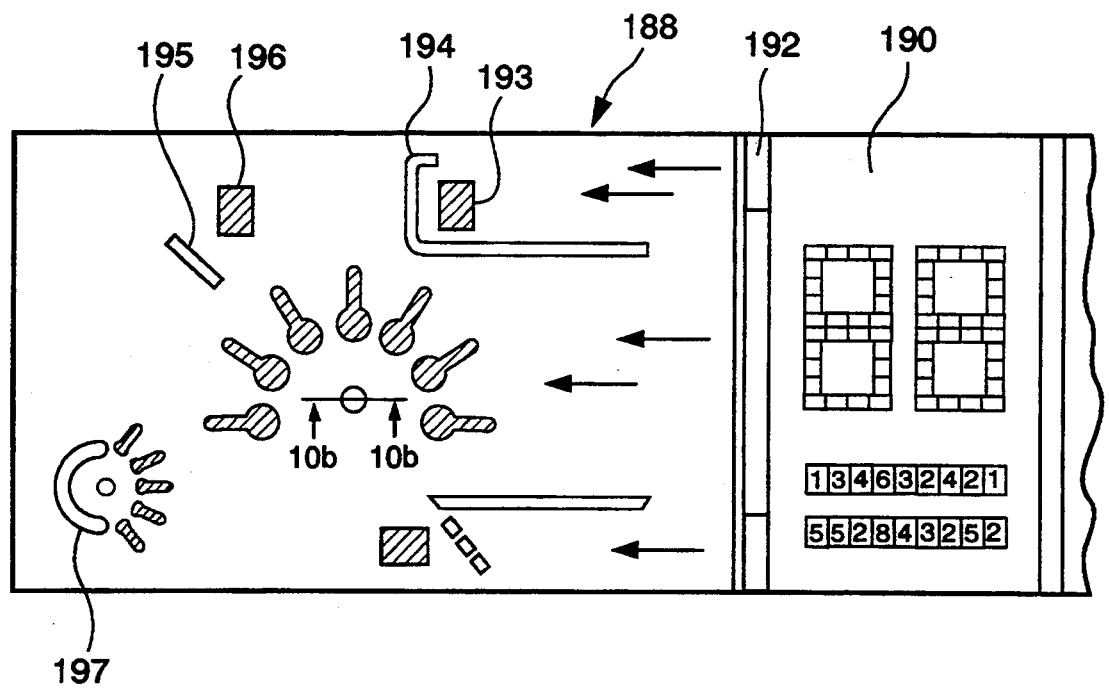
FIG. 10a is a partial front elevational view of a light distribution panel with the graphics layer removed.

In addition to controlling the local distribution of light by the application of paint or other material on to the light distribution panel to facilitate light escape, light can be controlled by deflectors and shrouds which are cut into the panel. FIG. 10a illustrates a front view of a light distribution panel 188 with the graphics layer removed. Light is supplied to the light distribution panel by a vacuum fluorescent display 190. In the region of the analog display a series of segments 191 are etched or painted in the immediate vicinity of each mark or indicia located on the graphics layer. By only illuminating these limited regions, light energy can be conserved.

In order to provide a telltale function, such as a turn signal or the like, the illuminescent strip 192 in a vacuum fluorescent display 190 may be formed of a series of independently illuminatable segments. The upper segment of strip 192 would only be activated when it was desirable to illuminate region 193 of the light distribution panel. A shroud 194 is cut into the acrylic light distribution panel to form a barrier for light from the central portion from the illuminescent strip 192 and to act as a reflector for light emanating from the upper independently operable portion of illuminescent strip 192. Shroud 194 is preferably cut into the acrylic sheet using a laser in order to form a relatively smooth reflected surface.

Reflector 195 is formed within the light distribution panel 188 in order to direct light to region 196 which is intended to be illuminated all of the time. By combining reflectors and opaque baffles, it is possible to manage the light distribution to achieve any one of a number of desired illumination patterns. As illustrated concave reflectors 197, reflectors can be utilized to intensify light in a region where it is needed, such as in the region of an illuminated pointer. Alternatively, baffles can be used to diffuse or attenuate light to shade areas where lower light intensity is desired.

Figure 10B:
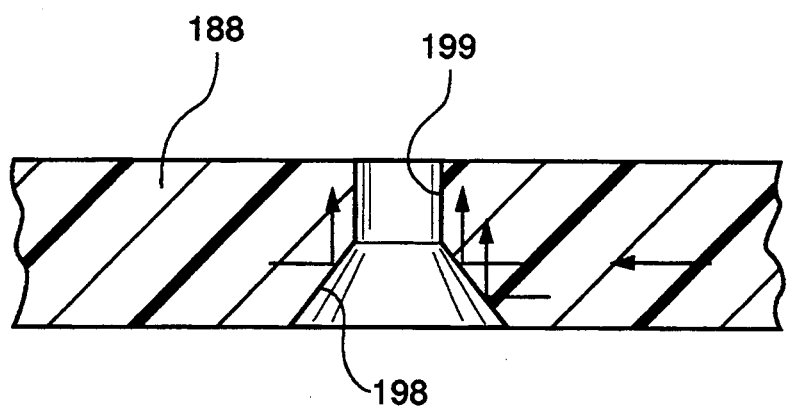
FIG. 10b is a cross-sectional view of the light distribution panel taken along line 10b–10d of FIG. 10a; end of insert.

FIG. 10b illustrates an enlarged cross-sectional side elevational view of the hole formed in illumination panel 188 through which an analog gauge pointer shaft passes. In instances where an illuminated pointer is utilized, it is necessary to direct light upward into the pointer hub to be subsequently redirected radially from the hub into the pointer arm. In order to efficiently direct light upward in region of the pointer, it has been found that a counter-sunk hole 198 formed in the back side of the illumination panel, in combination with cylindrical hole 199 having a frosted surface finish, will direct light into the pointer hub.

While preferably the instrument panels described previously are shown using the novel miniature electric motor described in detail in the following section, it should be appreciated that conventional electric motors such as air-core gauge motors or the like, can be utilized with these instrument panels.

Motor Construction

Figure 11:
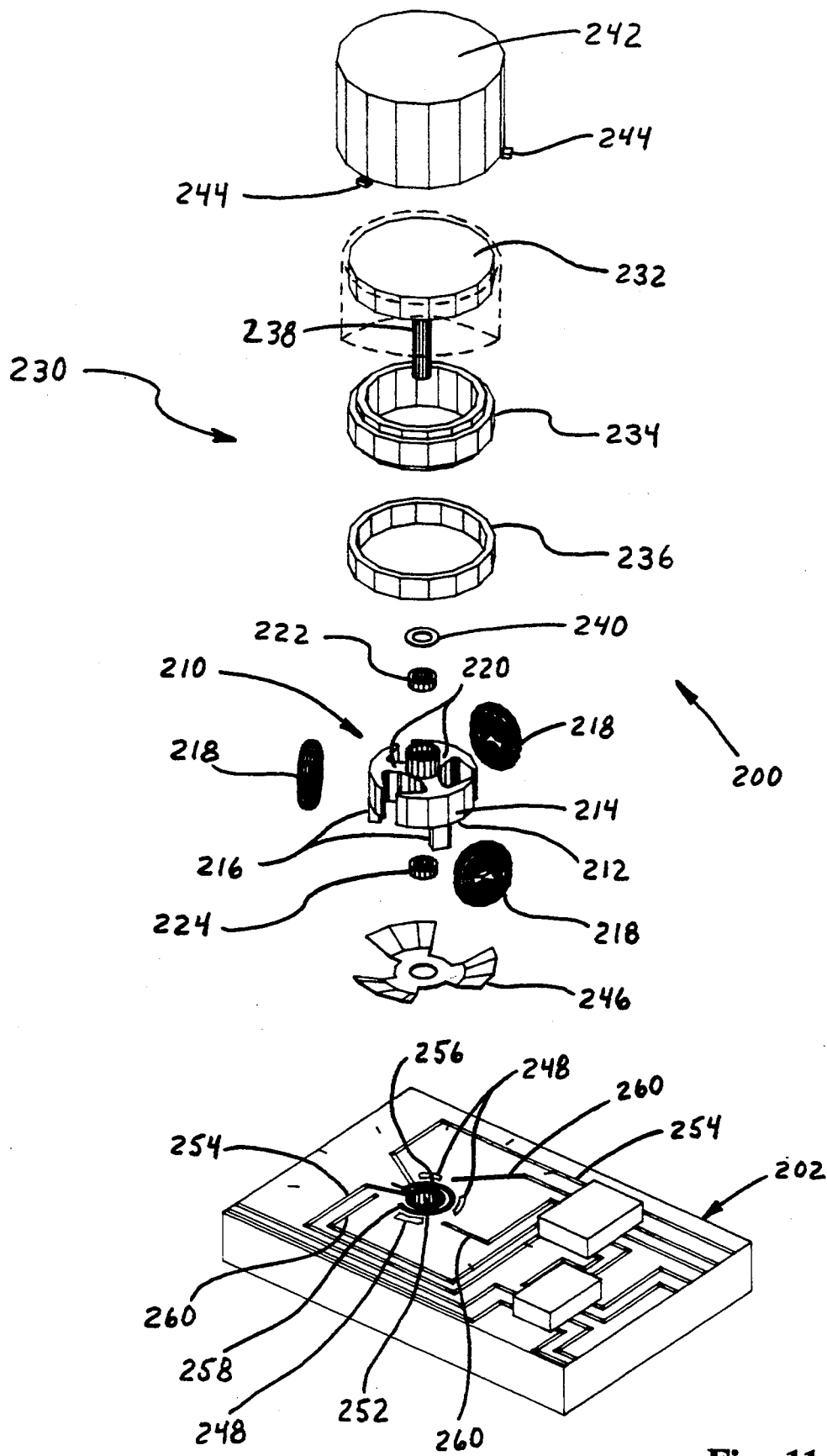
FIG. 11 is an exploded perspective view of an electric motor of the present invention and an associated substrate.

Referring now to FIG. 11, there is illustrated a motor, shown generally by reference numeral 200 and with respect to a substrate such as the back of a vacuum fluorescent display (VFD) unit 202. It is to be understood that the VFD unit 202 is not illustrated to scale.

The motor 200 can be generally described as a surface-mountable, brushless dc motor having a stator assembly shown generally by reference numeral 210. As shown, the stator assembly 210 includes an integrally formed stator 212 made of a ferromagnetic material and has a central portion with an aperture (not specifically illustrated) extending completely therethrough and three T-shaped equally-spaced, lobes or poles 214. In the preferred embodiment, the stator 212 is constructed of SAE 1005 carbon steel. The stator 212 has a diameter of 0.33" and is 0.32" long. As illustrated, each lobe 214 of the stator 212 includes a downwardly projecting mounting tab 216 which is received and retained on a corresponding pad 248 formed on the back of the VFD unit 202.

Figure 12A:
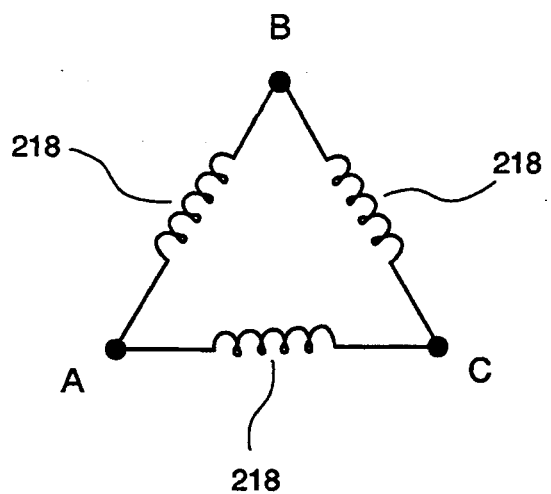
FIG. 12a is a schematic view of the coils of the motor shown in FIG. 11 connected in a Delta configuration.
Figure 12B:
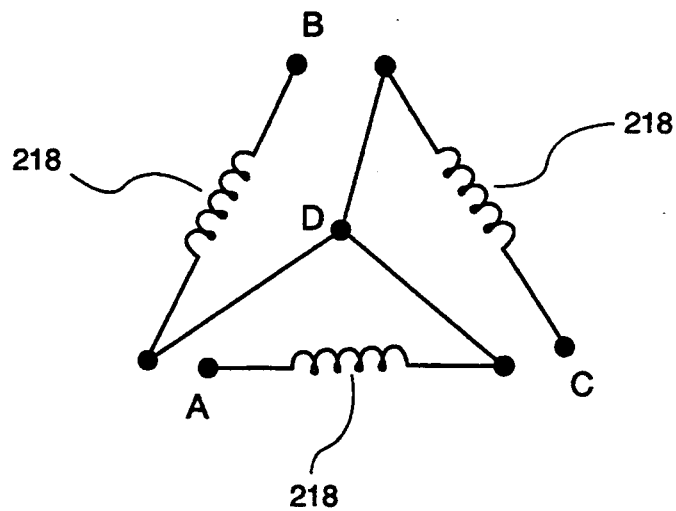
FIG. 12b is a schematic view of the coils of the motor shown in FIG. 11 connected in a Star configuration.
Figure 12C:
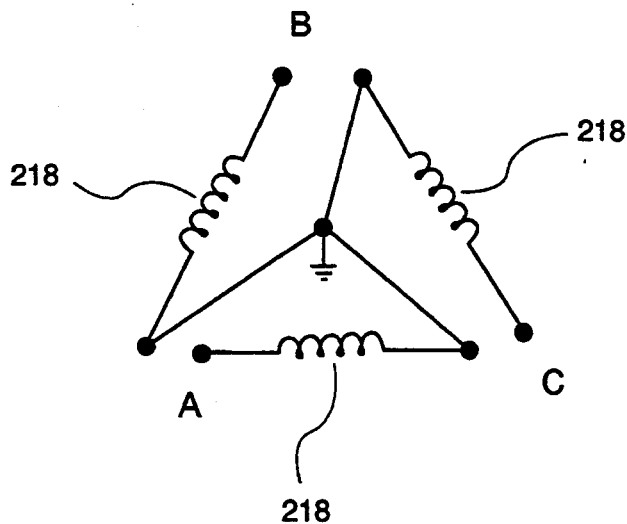
FIG. 12c is a schematic view of the coils of the motor shown in FIG. 11 connected in a Grounded-Star configuration.

As best shown in FIG. 11, three coils 218 are preferably wound on neck portions 220 of the lobes 214, thereby permitting the use of standard coil winding equipment. Referring now to FIGS. 12a–12c, the coils 218 can be electrically interconnected as a Delta connection, a Star connection or a Grounded-Star connection, respectively. Each type of connection offers a different level of motor control and efficiency. For example, a control voltage on any of the nodes A, B or C in a Delta connection affects all three coils, whereas a voltage on any of the nodes A, B or C in a Grounded-Star affects only one coil. Thus, it should be appreciated that the Grounded-Star offers the greatest level of flexibility in control strategy, and is more efficient than a Delta connection. Of course, instead of being grounded, the connection of FIG. 12c may be held at a predetermined reference level. The Delta connection of FIG. 12a, however, results in a higher torque for any given voltage. The torque can be as much as 50% higher for a similar voltage applied to the Star or Grounded-Star connection. Additionally, the Delta connection is easier to manufacture since there are fewer terminations and the coils 218 can be wound in a continuous fashion. In the preferred embodiment, therefore, a Delta connection is utilized.

Most preferably, each coil 218 is wound with approximately 150 turns of #38 AWG magnet wire, yielding a coil node resistance of approximately 5Ω when Delta connected. It should be appreciated that this construction results in a very low-cost and compact stator assembly 210. Additionally, since each of the coils 218 has a ferromagnetic core, the magnetic fields created when the coils 218 are energized are amplified. Consequently, the stator assembly 210 and therefore, the motor 200, has a low power consumption and high torque.

Figure 13:
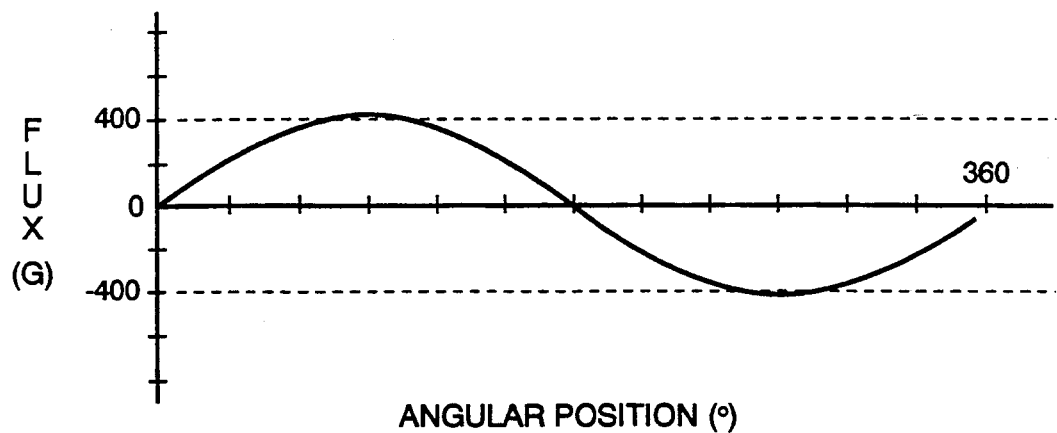
FIG. 13 is a graphical illustration of a nearly sinusoidal magnet flux profile for magnetizing the magnet of the motor shown in FIG. 11.

With continuing reference to FIG. 11, a rotor assembly, shown generally by reference numeral 230, includes a plastic cap 232, a magnet 234, an annular plastic ring 236 and a motor output shaft 238, all of which are secured together for rotation with respect to the stator assembly 210. Preferably, the magnet 234 is a ceramic magnet having a height of 0.40", an inner diameter of 0.37" and an outer diameter of 0.62". Also preferably, the magnet 234 is magnetized through its diameter to produce North and South poles. To magnetize the magnet 234, a nearly sinusoidal magnet flux profile, shown in FIG. 13, was utilized. As illustrated in FIG. 13, the magnet flux profile preferably has a peak flux of about 400 gauss (with an empty core).

Figure 14:
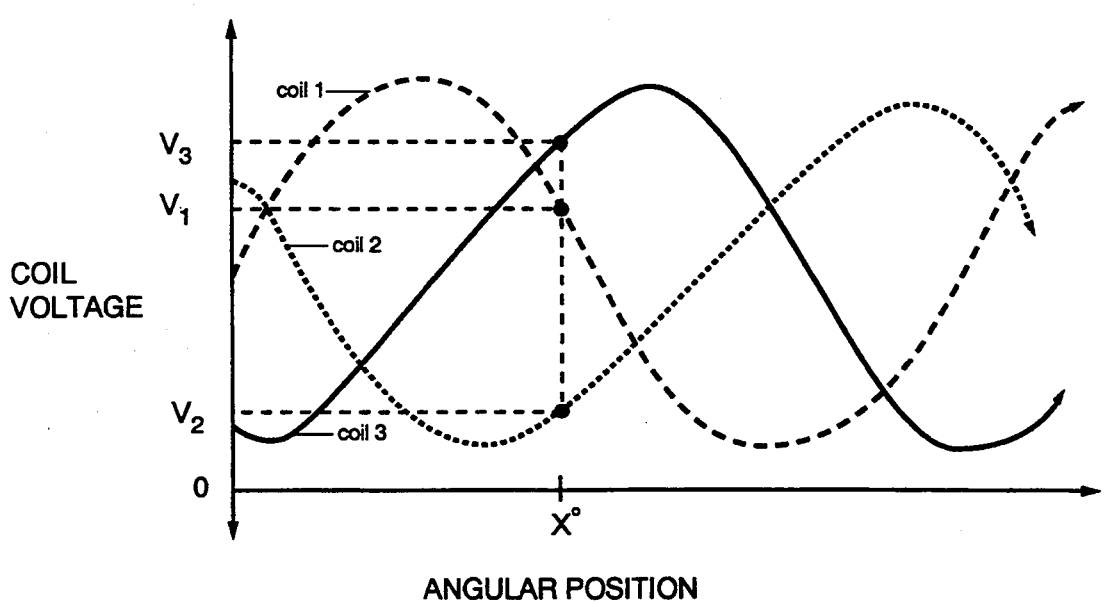
FIG. 14 is a graphical illustration of coil drive voltages, plotted versus angular position, for the coils shown in FIG. 11.

Referring now to FIG. 14, to accurately position the motor, the following coil voltages $V_1$, $V_2$ and $V_3$ are preferably applied to the coils 218:

$$V_1 = \text{SIN}(X) \tag{1}$$

$$V_2 = \text{SIN}(X + 120°) \tag{2}$$

and $$V_3 = \text{SIN}(X + 240°) \tag{3}$$

where "X°" represents the desired angular position from 0° to 360°. Thus, by applying various combinations of drive voltages to the coils 218, the angular position of the motor shaft 238 is essentially infinitely adjustable.

Coil voltages that are phase shifted by 120° work well the geometry of the coils 118. Although the drive voltages are shown to be generally sinusoidal, any other waveform, such as a square or triangle waveform, could be utilized. Preferably, peak drive current is approximately 0.25A per coil 218. Use of these drive voltages with the motor 200 constructed as disclosed herein yields output position linearity within 2°.

Figure 15:
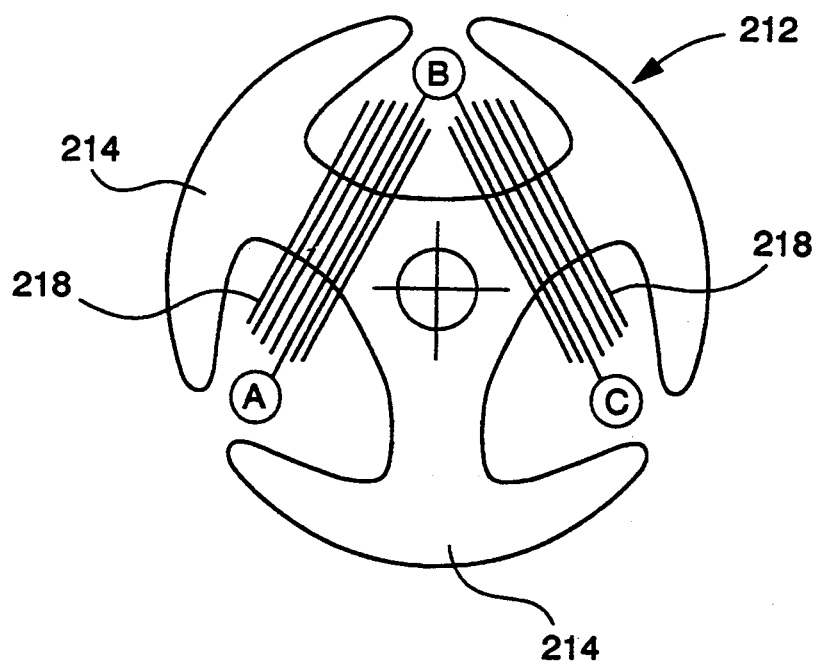
FIG. 15 is a partial plan view of an alternative stator assembly wherein there are fewer coils than stator lobes.

Referring now to FIG. 15, there is shown an alternative stator 212 and coil 218 assembly, wherein the number of stator lobes 214, or poles, exceeds the number of coils 218 wound thereabout. In this preferred embodiment, as illustrated, two coils 218 are wound about the three-lobed stator 212 and electrically connected at node "B". Of course, the two coils could be wound about any two of the lobes. It should be noted that although a third coil is absent, a third stator lobe is required for magnetic balancing.

The drive voltages for the stator/coil arrangement shown in FIG. 15 are preferably sinusoidal in shape and phase shifted from each other by about 120°, as previously described with respect to the motor embodiment shown in FIG. 11. Utilizing these drive voltages, the available angular sweep of the 2-coil embodiment remains a full 360°, although a reduced angular sweep is also possible. The torque delivered, however, is generally non-uniform. The reduction in the number of parts due to the absent coil and the reduced manufacturing time results in a cost savings. The 2-coil embodiment is thus ideal for use in an application which requires a reduced angular sweep, such as a fuel gauge in an automotive instrument cluster.

Figure 16:
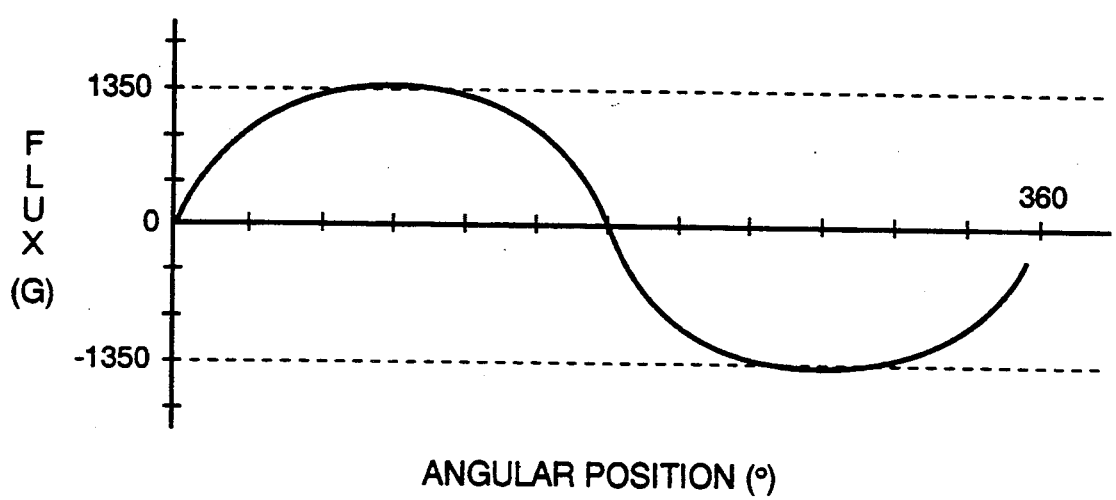
FIG. 16 is a graphical illustration of a nearly trapezoidal magnet flux profile for magnetizing the magnet of the motor shown in FIG. 11.

Since some applications are best suited by a motor capable of producing a reduced set of output positions, or steps, the motor 200 may be constructed to provide such a reduced set of positions. For such an alternative application, the coils 218 are preferably wound about the stator lobes 214 with about 200 turns of #39 AWG wire, so as to yield node resistances of about 10Ω. The ceramic magnet 234 is preferably magnetized with an approximately trapezoidal flux profile, shown in FIG. 16. As illustrated in FIG. 16, the trapezoidal flux profile has a peak flux of approximately 1350 gauss.

Referring once again to FIG. 11, the magnet 234 is affixed to the plastic cap 232 on one face thereof and the plastic ring 236 is affixed to the other face of the magnet 234. The output shaft 238 is formed on or otherwise attached to the plastic cap 232 at the end thereof. The output shaft 238 is sized to extend through the magnet 134 and the plastic ring 236. Although the magnet 234 is shown to be a generally cylindrical magnet, the magnet could be constructed as a band or ring with a plurality of individual magnets disposed thereabout.

With continuing reference to FIG. 11, a thrust washer 240 is preferably positioned on the output shaft 238 between the plastic cap 232 and the stator assembly 210. A pair of optional press-in bushings 222 and 224 are also preferably positioned at the top and bottom of the stator 212, respectively, within its central aperture to help align the output shaft 238. In the preferred embodiment, when the motor 200 is assembled, the output shaft 238 extends through the thrust washer 240, the bushing 222, the aperture of the stator 212 and the bushing 224, such that the magnet 234 surrounds, or is without, the stator 212 and the coils 218 supported thereon and immediately adjacent thereto. This construction provides a compact closed magnetic circuit with a small air gap.

Due to the ferromagnetic nature of the stator 212, the magnet 234 generally centers itself on the magnetic center of the stator, which is at or slightly before the center of mass of the stator. This construction results in the motor 200 having an inherent, self-correcting position memory. This self-correcting feature allows the motor 200 to correct for any positioning problems every time the coils 218 are energized. Thus, positioning inaccuracies are remedied with the next position adjustment. Additionally, the motor 200 has a stable "off" (i.e. unpowered) position. These features give the motor 200 an advantage over stepper-type motors, which have inherent positioning problems.

In one preferred embodiment, a cap 242 encloses the assembled motor 200. As shown in FIG. 11, the cap 242 includes a plurality of mounting tabs 244, thereby permitting the motor 200 to be surface-mounted on the VFD unit 202 or some other substrate, such as a circuit board (not specifically illustrated), with the output shaft 238 extending therethrough as described below. The cap 242 is intended to function as both a magnetic flux concentrator for the magnet 234 and as a magnetic shield for the entire motor assembly, preventing external magnetic fields from adversely affecting motor performance and is constructed of an appropriate steel. The cap 242 serves the additional function of protecting the motor assembly from the environment, such as dust, dirt and the like.

Alternatively, an inverted cup-shaped cap 250, shown in phantom in FIG. 11, could be utilized in place of the cap 242 and plastic cap 232. In this preferred embodiment, the cap 250 is constructed of low carbon steel with the motor shaft 238 being formed thereon. Most preferably, the cap 250 is a unitary piece and is sized (e.g. 0.030" thick and approximately 0.500" long) to substantially enclose the magnet 234 and stator assembly 210 and the rotor assembly 230. Thus sized, the cap 250 provides protection for the motor assembly from the environment. Primarily, the cap 250 serves the dual functions of a magnetic flux guide and concentrator for the magnet 234, which is preferably press-fitted into the cap 250, and as an electromagnetic shield for the motor assembly, preventing external magnetic fields from affecting the performance of the motor 200.

With continuing reference to FIG. 11, the output shaft 238 also preferably extends through a piezoelectric brake 246 and the VFD unit 202. A glass tube 252 extends through the VFD unit 202, permitting the shaft 238 to extend therethrough while maintaining the vacuum within the VFD unit. When sized appropriately, the glass tube 252 also acts as a bearing to facilitate shaft rotation. Preferably, two conductive electrical traces 254 located on the VFD unit 202 provide power and ground to the piezoelectric brake 246 and, in one embodiment, ground to the coils 218, thereby allowing the motor 200 and brake 246 to be accurately controlled, as described in greater detail hereinbelow. One of the traces 254 defines a power ring 256 and the other trace defines a ground ring 258 for the piezoelectric brake 246. The brake 246 is typically soldered to the rings 256 and 258. Three other traces 260 supply power to the coils 218.

One of ordinary skill in the art could imagine many applications for the motor of the present invention. For many of these applications, the providing of electrical connections to the motor and the providing of a suitable bearing surface associated with the mounting or securing of the motor 200 to a suitable substrate is of significant importance. Since the motor 200 is a low torque, small motor, friction is, of course, a concern.

Figure 17:
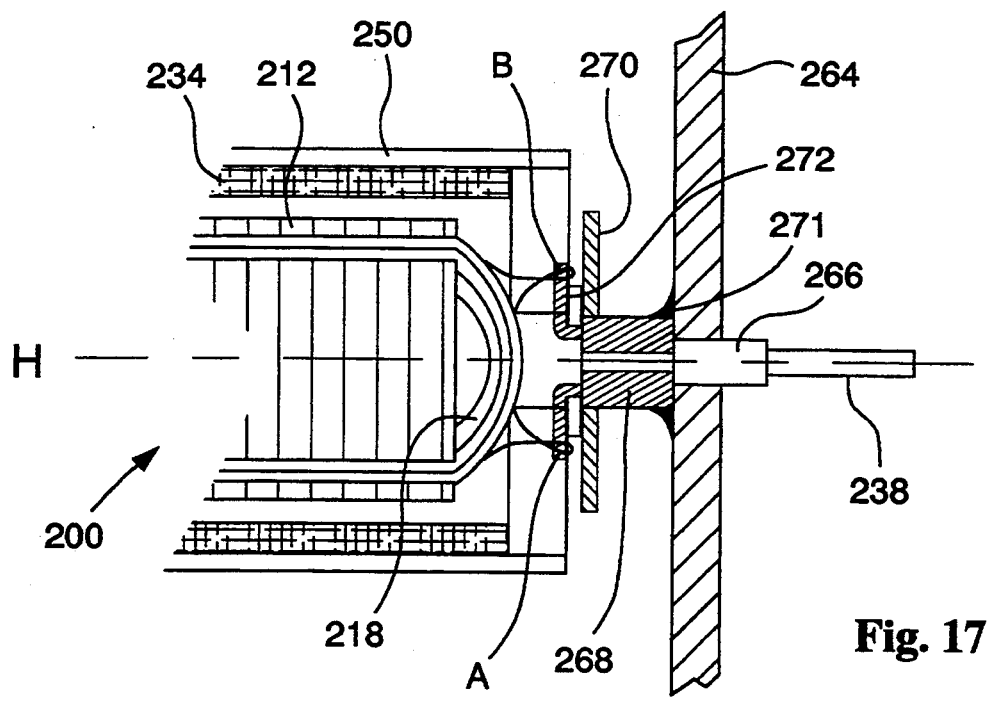
FIG. 17 is a partial cross-sectional view of a first bearing embodiment for use with the motor shown in FIG. 11.

Referring now to FIG. 17, there is shown a first preferred bearing embodiment for use with the motor 200. As illustrated, the motor 200 is mounted on a substrate 264, such as a circuit board. The substrate 264 includes a tube 266 which extends therethrough and receives the motor shaft 238. In the preferred embodiment, the tube 266 is constructed of stainless steel, and has a diameter approximately 0.001" larger than the diameter of the shaft 238 to provide a bearing surface. The inside surface of the tube 266 could be grooved to reduce the surface area contacting the shaft 238, thereby reducing the friction. A motor commutator 268 is fixedly attached to the substrate 264 by solder 271 or the like and includes three segments, two of which are illustrated. The commutator 268 also includes a plurality of coil terminators 272, each in electrical communication with an associated commutator segment. The coil terminators 272 are in electrical communication with the coil nodes A, B and C, only two of which are illustrated in FIG. 17. In the preferred embodiment, a brake disc 270 is supported by the commutator. The brake disc 270 is constructed of a low carbon steel, is 0.030" thick and has a 0.35" outer diameter. Preferably, the brake disc 270 and the stator (i.e. the stator lamination stack) are separated by a non-magnetic gap of 0.075". The brake disc 270 causes the magnet 234 to be displaced from its magnetic balance position by 0.020" with respect to the stator 212. By applying power to at least one of the coils 218, the stator 212 and magnet 234 are caused to realign, freeing the magnet 234 from the brake surface for rotation.

Figure 18:
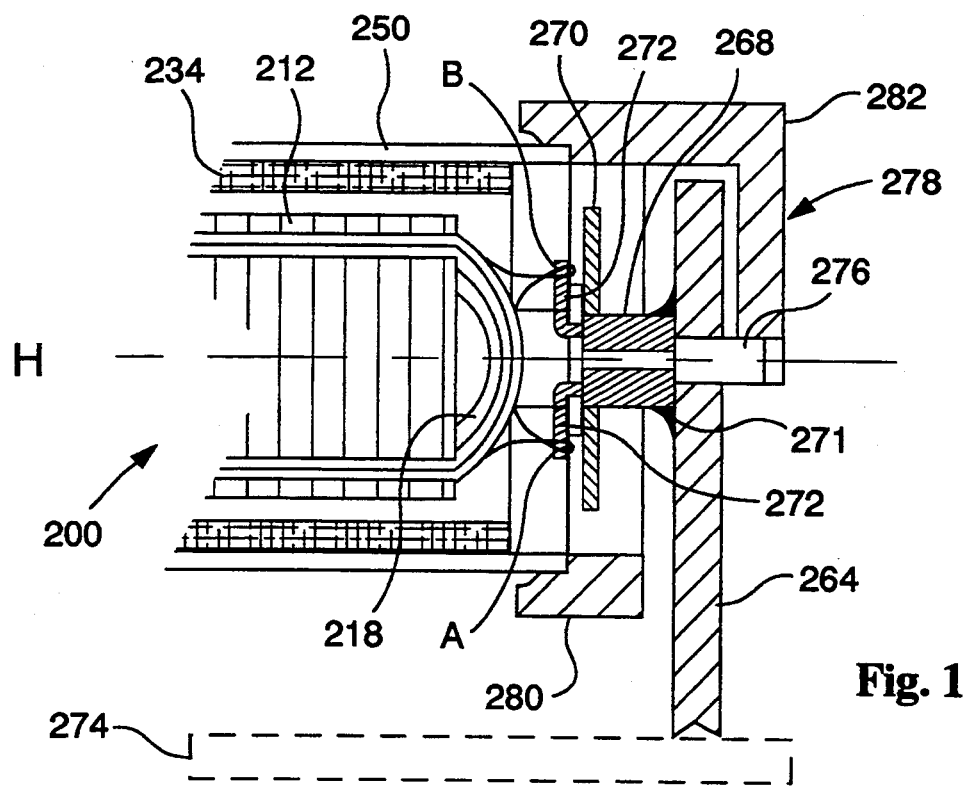
FIG. 18 is a partial cross-sectional view of a second bearing embodiment for use with the motor shown in FIG. 11.

Referring now to FIG. 18, there is shown an alternative bearing embodiment for the motor 200. As shown in FIG. 18, the motor 200 is mounted on a substrate 264, such as a circuit board. Alternatively, the substrate 264 could be a flex-strip, including electrical conductors, which is electrically connected to a circuit board 274, assuming proper support (not specifically illustrated) is provided for the motor 200. A stator shaft 276 provides support for rotation of the magnet 234 about the stator 212. The motor commutator 268 is preferably fixedly attached to the substrate 264 by solder 271 or the like and includes three segments, two of which are illustrated. The commutator 268 also includes a plurality of coil terminators 272, each in electrical communication with an associated commutator segment. The coil terminators 272 are in electrical communication with the coil nodes A, B and C, two of which are illustrated. As illustrated, a rotor support 278 includes a ring portion 280 which is preferably affixed to the cap 250 to provide proper alignment. The ring portion 280 includes a central aperture through which the commutator 268 extends. The rotor support 278 also preferably includes an arm portion 282, which is formed on the ring portion 280. Thus, the rotor support 278 (i.e. the ring portion 280 and the arm portion 282) rotates about the motor axis "H". Although this construction provides a good bearing embodiment, the presence of the substrate 264 restricts the rotation of the magnet 234 due to the arm portion 282.

Figure 19:
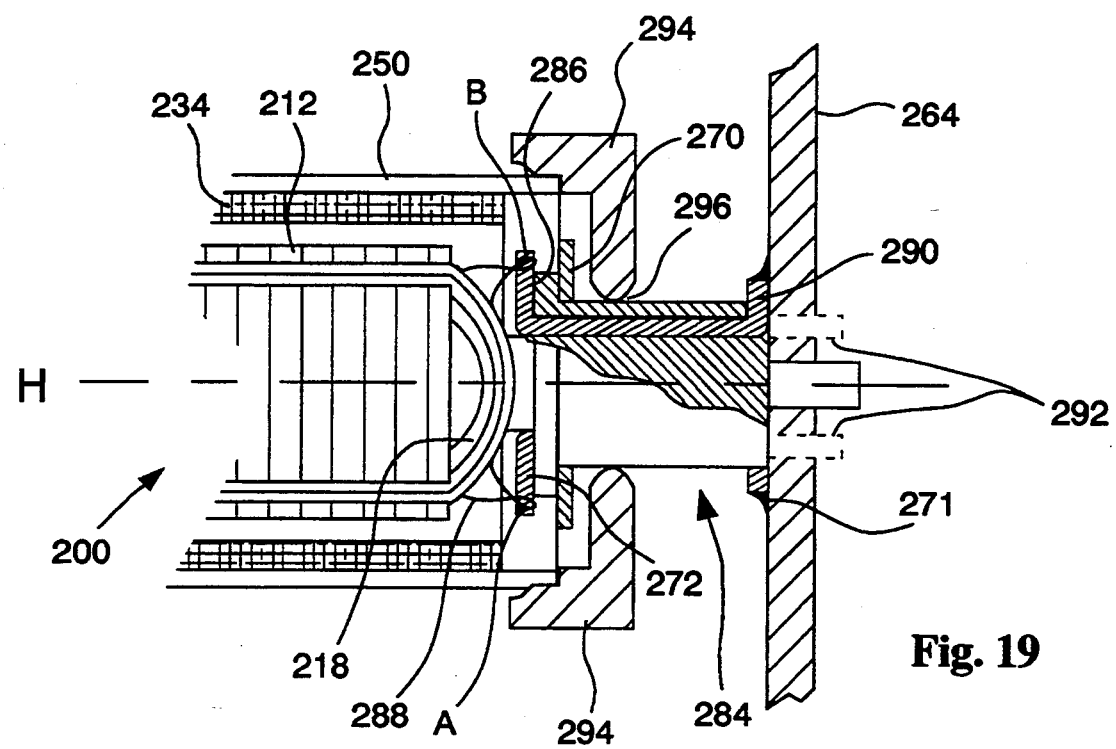
FIG. 19 is a partial cross-sectional view of a third bearing embodiment for use with the motor shown in FIG. 11.

Turning now to FIG. 19, there is shown another alternative bearing embodiment for the motor 200. As illustrated, the motor 200 is preferably mounted on a substrate 264, such as a circuit board. In this embodiment, a connector bearing assembly shown generally by reference numeral 284 replaces the commutator 268 of the previous two bearing embodiments shown in FIGS. 17 and 18. The connector bearing 284 includes a plurality of coil terminators 286 which extend through the connector bearing 284 from a point inside the motor 200 to the substrate 264. The coil terminators 286 are electrically connected to coil termination wires 288 which are thus in electrical communication with the substrate 264. The coil terminators 286 cooperate with the substrate 264 so as to form either a surface mounting connection shown generally by reference numeral 290 or a through-hole connection shown in phantom generally by reference numeral 292. A bearing cap 294 is affixed to the magnet 234 and the cap 250. In the preferred embodiment, the bearing cap 294 is constructed of Delrin and includes a central aperture through which the connector bearing 284 extends. The bearing cap aperture is sized such that the connector bearing 284 contacts the bearing cap, creating a bearing surface 296.

Figure 20:
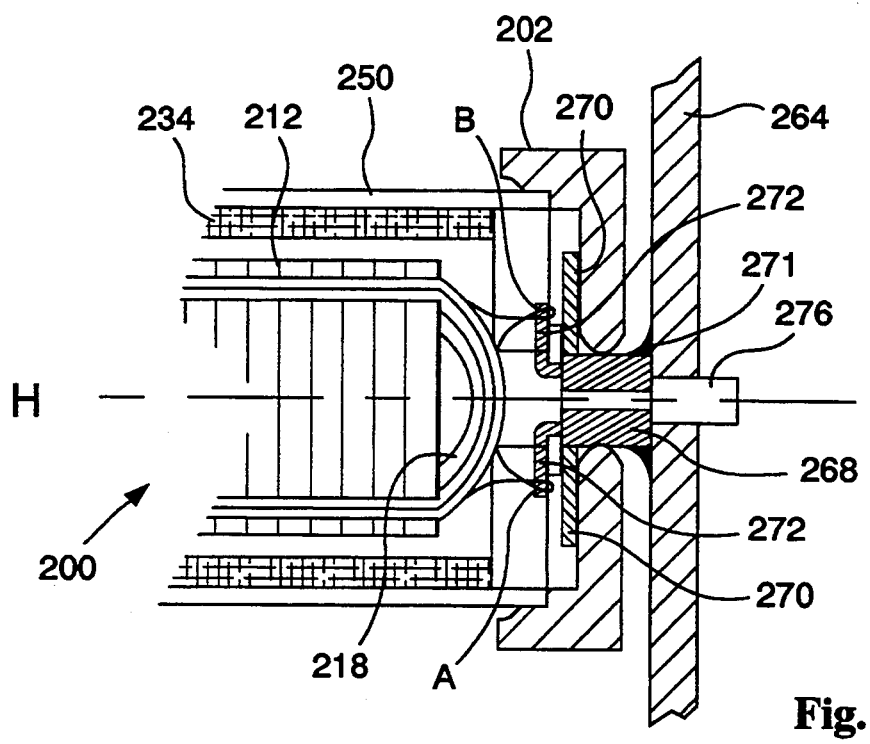
FIG. 20 is a partial cross-sectional view of a fourth bearing embodiment for use with the motor shown in FIG. 11.

Referring now to FIG. 20, there is shown yet another alternative bearing embodiment for the motor 200. In this preferred embodiment, the commutator 268 provides the bearing surface and the means through which the coils are electrically connected to the substrate 264, such as a circuit board. As in the embodiment shown in FIG. 17, the commutator 268 is fixedly attached to the substrate 264 by solder 271 or the like and includes three segments, two of which are illustrated. The commutator 268 also includes three coil terminators 272, each in electrical communication with an associated commutator segment. The coil terminators 272 are in electrical communication with the coil nodes A, B and C, only two of which are illustrated in FIG. 20. The stator shaft 276 extends through the commutator 268 and the substrate 264. A generally circular shaped bearing cap 302 is affixed to the magnet 234 and the cap 250 for rotation therewith. The bearing cap 302 is preferably constructed of Delrin and includes a central aperture disposed therein through which the commutator 268 extends.

Referring once again to FIG. 11, the piezoelectric brake 246 is generally concave in shape in its "unpowered" state. Thus, the piezoelectric brake 246 is normally biased against the plastic ring 236, i.e. the brake is normally "set", thereby preventing rotation of the output shaft 238 and any load attached thereto, (e.g. a pointer) after the load is in a desired position. When the brake 246 is energized, however, it deflects generally flat and away from the plastic ring 236, releasing the brake 246 and freeing the output shaft 238 to rotate to a new desired angular position.

Alternatively, braking of the motor 200 can be achieved without the use of the piezoelectric brake 246. Since the stator 212, as shown in FIG. 11, has more magnetic mass on "top" than on "bottom", it therefore has a magnetic center located above its physical center. As described in greater detail above, the magnet 234 centers itself around the magnetic center.

Figure 21:
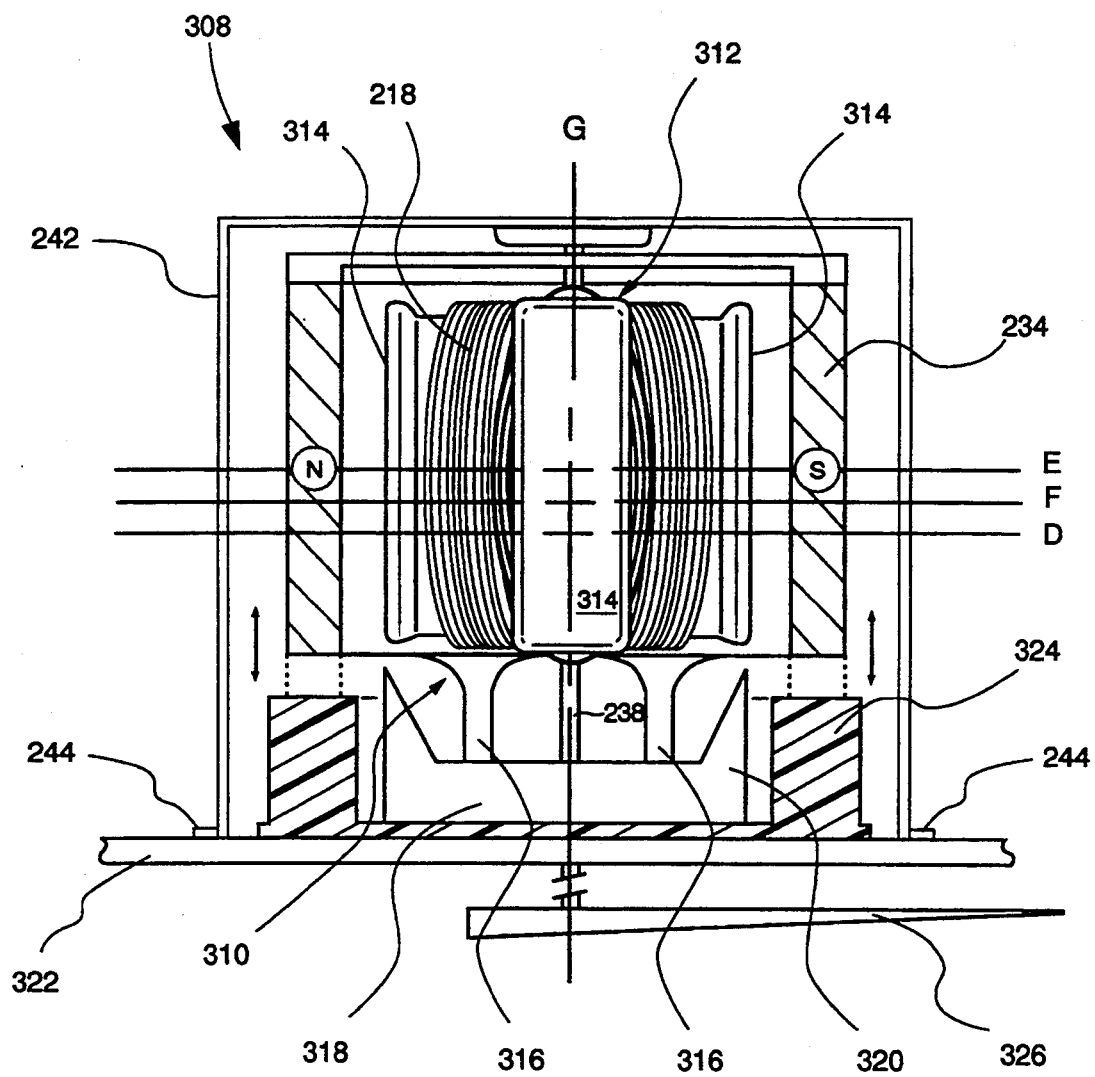
FIG. 21 is a view, partially broken away and in cross section, of an alternative embodiment of the motor of the present invention.

Referring now to FIG. 21, an alternative motor embodiment is shown generally by reference numeral 308, including an alternative stator assembly generally indicated by reference numeral 310. The stator assembly 310 includes an integrally formed ferromagnetic stator 312 having a central portion with an aperture (not specifically illustrated) extending completely therethrough and three generally T-shaped equally-spaced, lobes or poles 314. Each lobe 314 of the stator 312 has an integrally-formed, downwardly projecting magnetic leg 316 which passes through or around an annular magnetic permeable base 318. The magnetically permeable base 318 has an axially projecting lip portion 320 which cooperates with the rest of the magnetic circuit to provide an essentially closed-loop flux path. The magnetically permeable base 318 is preferably positioned centrically within and fixedly attached to a substrate, such as a circuit board 322. The legs 316 of the stator assembly 310 permit surface mounting to the circuit board 322. This design results in the combined magnetic permeability center of the assembly 310 and the base 318 to be located at a position, labeled as "D", being below its electromagnetic center, labelled as "E" in FIG. 21.

With continued reference to FIG. 21, when the coils 218 are not powered, the magnetic permeability center "D" of the stator 312 and magnetically permeable base 318 causes the center of magnetism in the magnet 234 to seek the level "D". Before the magnet 234 reaches level "D", the magnet 234 contacts brake element 324 and stops at level "F". The surface of brake element 324 can be textured or the material can be selected to achieve coefficient(s) of friction as desired. If the magnetic base 318 were not present, the magnet's center of magnetism would be attracted only to the stator 231 and the magnet would tend to seek level "E".

With the magnetic base 318 in place as shown in FIG. 21, the magnet 234 will move "down" from level "E" toward level "D" and will stop at level "F" due to the magnet 234 contacting the brake element 324. The magnet 234 is held in place and prevented from rotating about motor axis "G", thereby holding pointer 326 in place, which is affixed to magnet 234 by the shaft 238.

When a new pointer position is desired, the control means applies a drive voltage to one or more of the coils 218, causing an electromagnetic field to be set up at level "E". This magnetic field at level "E" is generally attracting the center of magnetism of magnet 234 toward that level. At the same time, the center of magnetism of magnet 234 is attracted to level "D" due to the permeability of magnetic base 318. By having appropriate drive voltage applied to one or more coils 218 the "up" force on the magnet 234 toward level "E" is greater than the "down" force toward level "D". As a result, the magnet 234 moves away from level "F" toward level "E", thereby releasing magnet 234 from the brake element 324.

Thus, the drive voltage(s) applied to the coil(s) 218 should be capable of rotating the pointer 326 to the new angular position about axis "G" and also be capable of releasing the magnet 234 from the brake element 324. After appropriate time to allow pointer 326 to achieve its new angular position, power is removed from coils 218, allowing the magnet 234 to be pulled down to level "F" and be held by brake element 324 until it is desired to move the pointer 326 to a new position.

Figure 22:
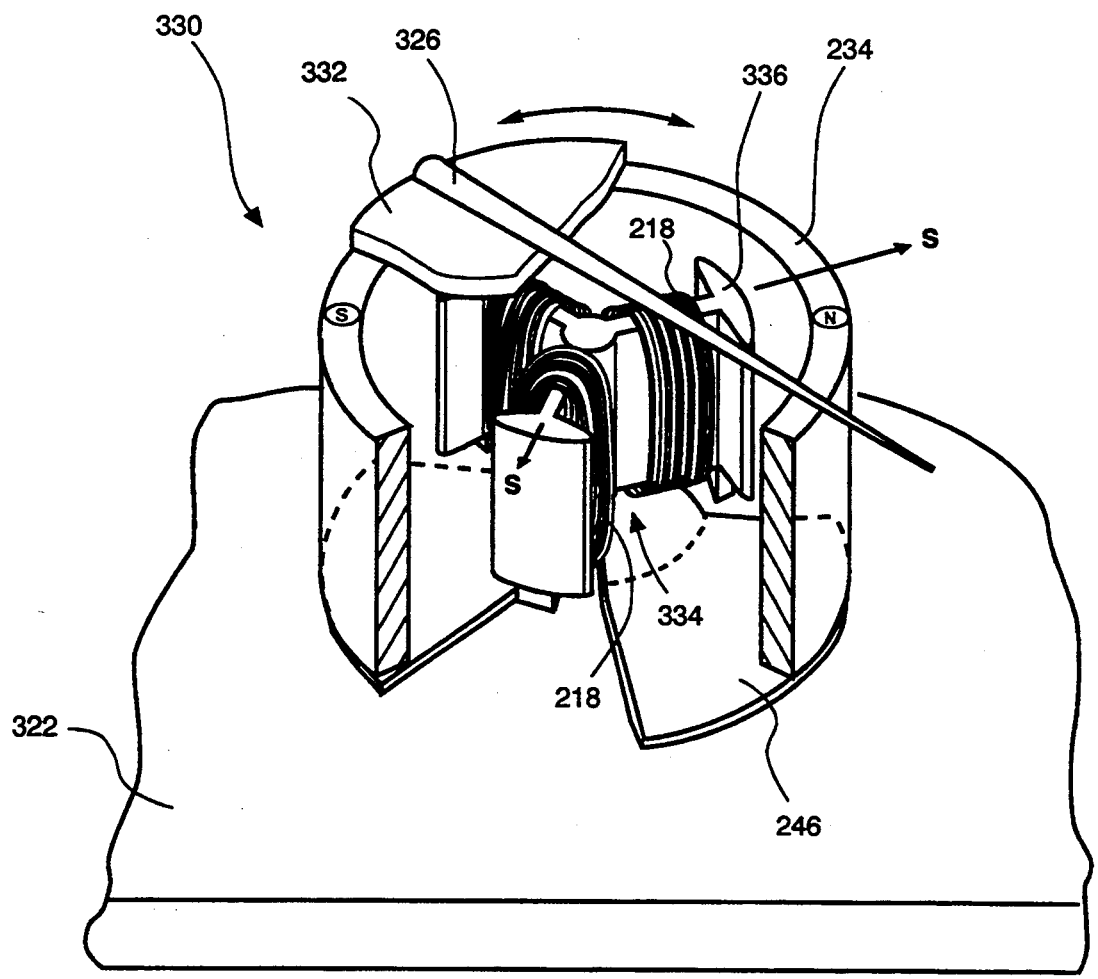
FIG. 22 is a view, partially broken away and in cross section, of still another embodiment of the motor of the present invention, adapted to be mounted on the front surface of a substrate.

Referring now to FIG. 22, an alternative motor embodiment is generally indicated by reference numeral 330. The motor 330 is a front mount design, capable of being surface-mounted to the front of the substrate, such as a circuit board 322 or the VFD 202 shown in FIG. 11. In this embodiment, the pointer 326 is fixedly attached to a lid 332, instead of being affixed to the motor output shaft. Preferably, the lid 332 is constructed of plastic and is fixedly attached to the magnet 234 for rotation therewith relative to the stator assembly, shown generally by reference numeral 334. The stator assembly 334 includes a stator 336, which is substantially similar to the stator 312 previously described. The stator 336, however, is without an aperture extending through its central portion.

With continuing reference to FIG. 22, when the piezoelectric brake 246 and the coils 218 are energized, the lower surface of the magnet 234 is disengaged from the brake 246. The magnet 234 rotates relative to the stator 336, as shown by the arrows, until the poles of the stator and the magnet 234 are aligned to provide a stable position. The pointer 326 is thus displaced to a new angular position, at which time the coils 218 and the brake 246 may be deenergized. The brake 246 then returns to its concave shape, braking and holding the magnet 234 (and the pointer) in place.

Figure 23:
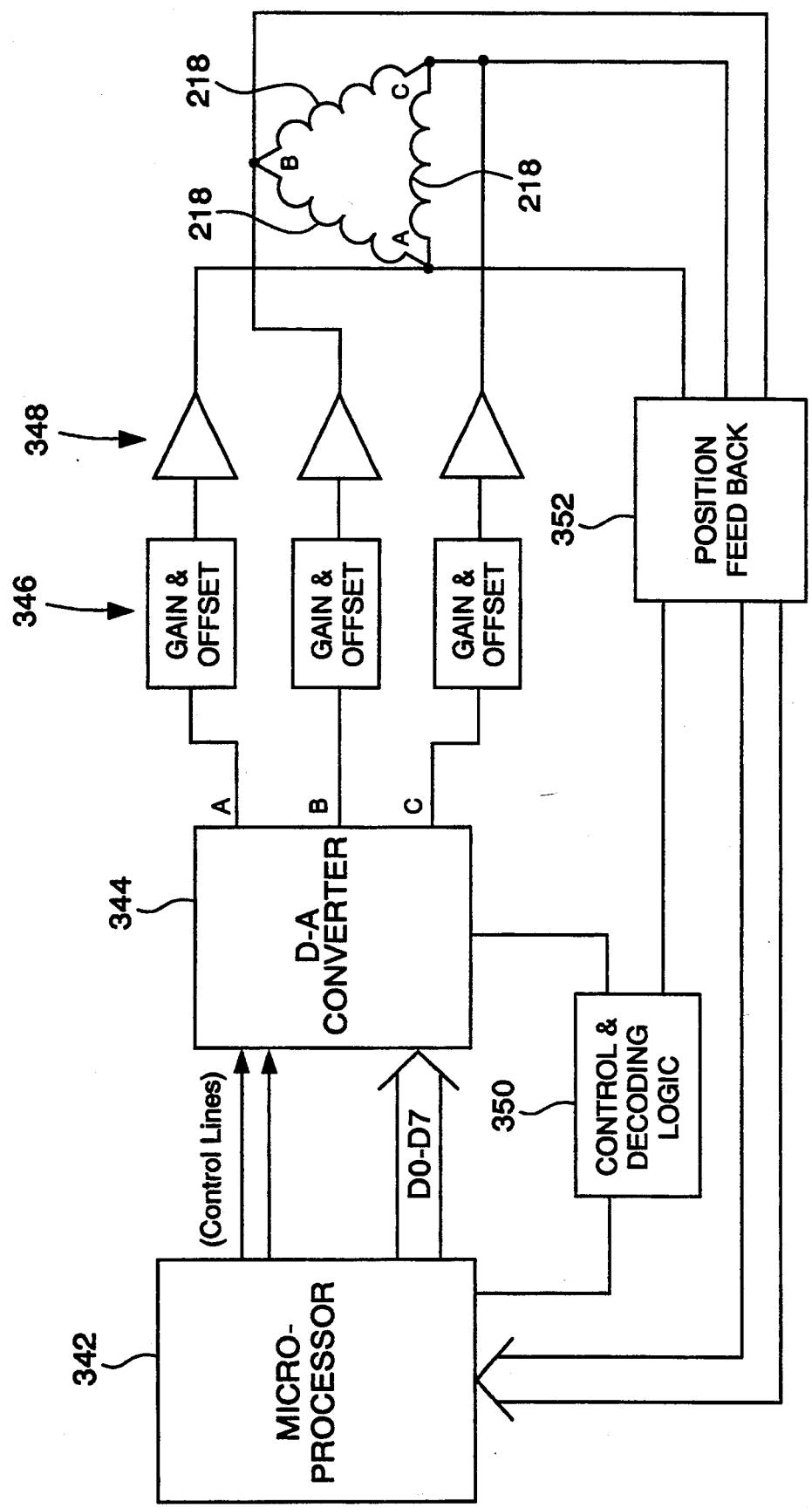
FIG. 23 is a schematic block diagram of a first coil drive system shown for use with a motor constructed in accordance with the present invention.

Referring now to FIG. 23, there is illustrated a block diagram for a first coil drive system shown generally by reference numeral 340. The coil drive system 340 preferably includes a microprocessor 342, a digital-to-analog (D/A) converter 344, gain and offset circuitry 346 and a power amplifier stage shown generally by reference numeral 348. The microprocessor 342, such as a 68HC05 series microprocessor, commercially available from Motorola, of Phoenix, Ariz., United States of America, reads and processes inputs from sensors not specifically illustrated to generate a desired angular position for the motor. Preferably, data corresponding to the coil drive voltages (shown in FIG. 14) are stored in look-up table in memory not specifically illustrated. This desired position is communicated as a digital signal to the D/A 344, such as 86021, an 8-bit, 4-channel D/A commercially available from the Microelectronics IC Divisions of Fujitsu, of San Jose, Calif., United States of America, which converts the digital signal to a corresponding analog signal. Accurate communication between the microprocessor 342 and the D/A 344 is assured by standard control and decoding logic 350, which functions to select a D/A channel, and the like. Depending on which coils need to be energized to rotate the motor to the desired position, the analog position signal is next communicated to the appropriate gain and offset circuitry 346 and the power amplifier stage 348. The power amplifiers 348 function to amplify the sinusoidal coil drive voltage signals, which can be at rather low levels, preferably to values of between approximately 3 V to approximately 7 V. Position sensor circuitry 352 monitors the coil voltages and provides position feedback signals related to the angular position of the motor shaft to the microprocessor 342. Thus, it should be appreciated that the microprocessor based system 340 is fully programmable, providing for control of actual gauge movement through coil energization as well as providing for control of "when" the coils are energized.

Figure 24:
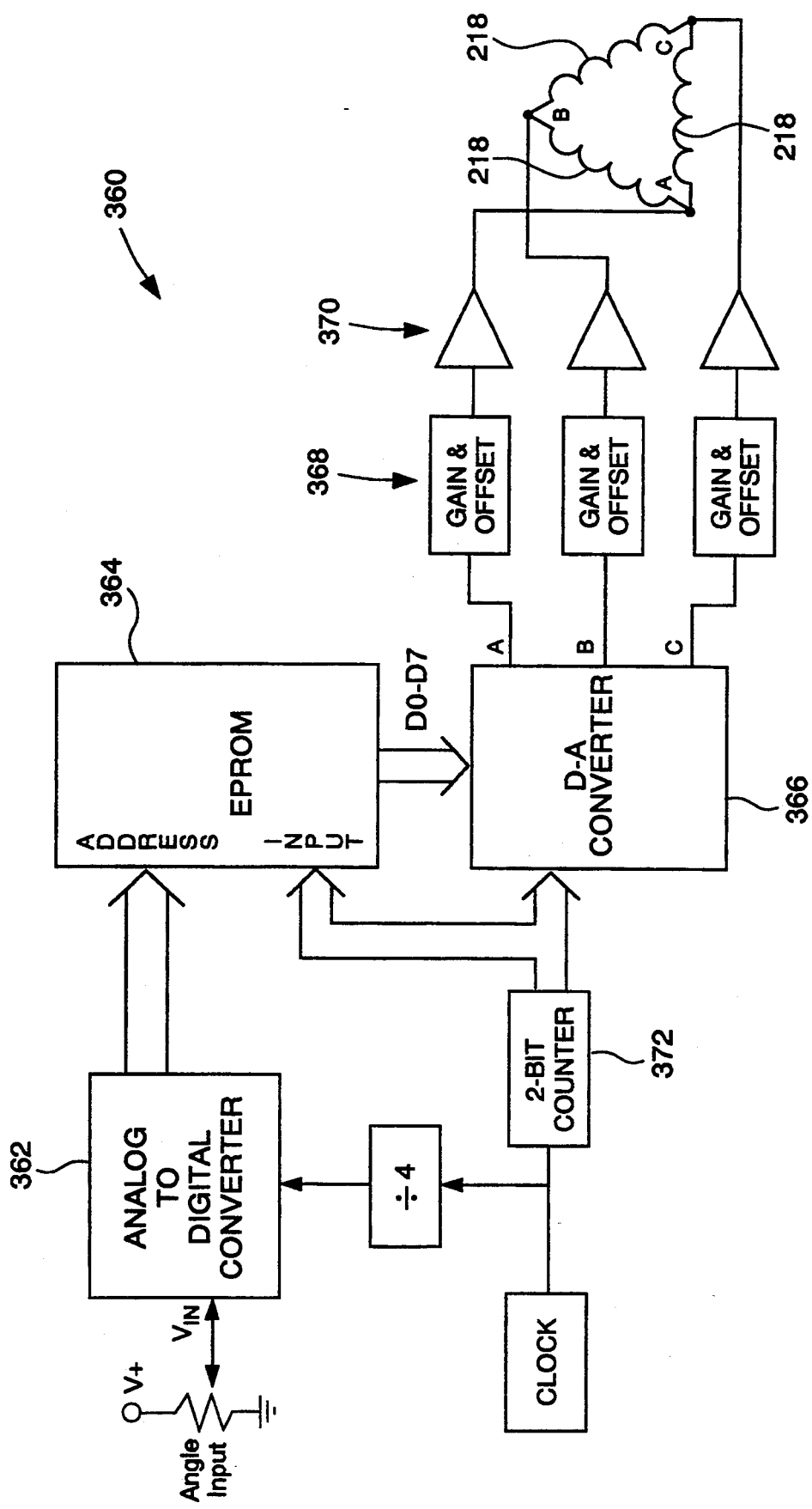
FIG. 24 is a schematic block diagram of a second coil drive system shown for use with a motor constructed in accordance with the present invention.

Turning now to FIG. 24, there is illustrated a block diagram for an alternative programmable coil drive system, shown generally by reference numeral 360. As illustrated, the coil drive system 360 includes an analog-to-digital (A/D) converter 362, an electrically programmable read-only memory (EPROM) 364, a D/A 366, gain and offset circuitry shown generally by 368 and a power amplifier stage shown generally by 370. An analog voltage signal ($V_{in}$), such as from a fuel level sensor, is provided to the A/D 362, such as ADC0808, commercially available from National Semiconductor, of Santa Clara, Calif., United States of America. The A/D 362, as is known, converts this analog signal, approximately every four (4) clock ticks, to a corresponding digital signal and communicates the digital signal to the EPROM 364. The digital signal actually represents a base address in the EPROM, which address contains digital data representing coil drive voltage for a node (e.g. node A). The coil drive voltages for nodes B and C are preferably located in the next two address locations, which are accessed after appropriate signal from the 2-bit counter are communicated to the EPROM. Thus, the EPROM 364 provides the data required to generate the sinusoidal drive voltages (such as those shown in FIG. 14) to rotate the motor to the desired angular position. Of course, the EPROM 364 could have data representing any other waveform, such as a square or triangle waveform. The digital data is communicated by the EPROM 364 to the D/A 366. The 2-bit counter 372 provides channel select data to the D/A 366. Further processing of the coil drive voltages by the gain and offset circuitry 368 and the power amplifiers 370 is substantially the same as described above with reference to FIG. 23. Thus, the programmable drive system 360 is a continuous system, in that $V_{in}$ is read and the motor is driven.

Figure 25:
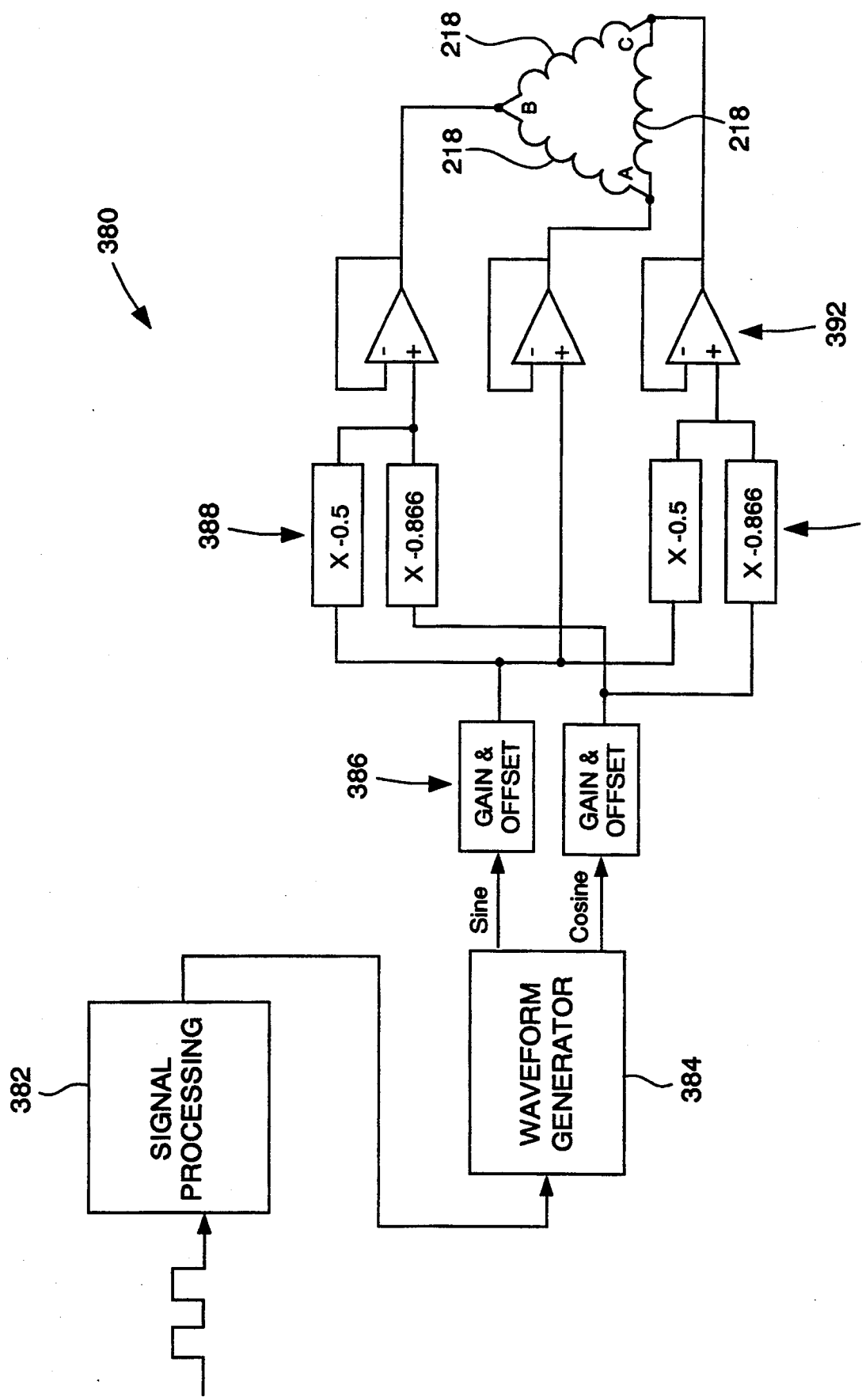
FIG. 25 is a schematic block diagram of a third coil drive system shown for use with a motor constructed in accordance with the present invention.
Figure 26:
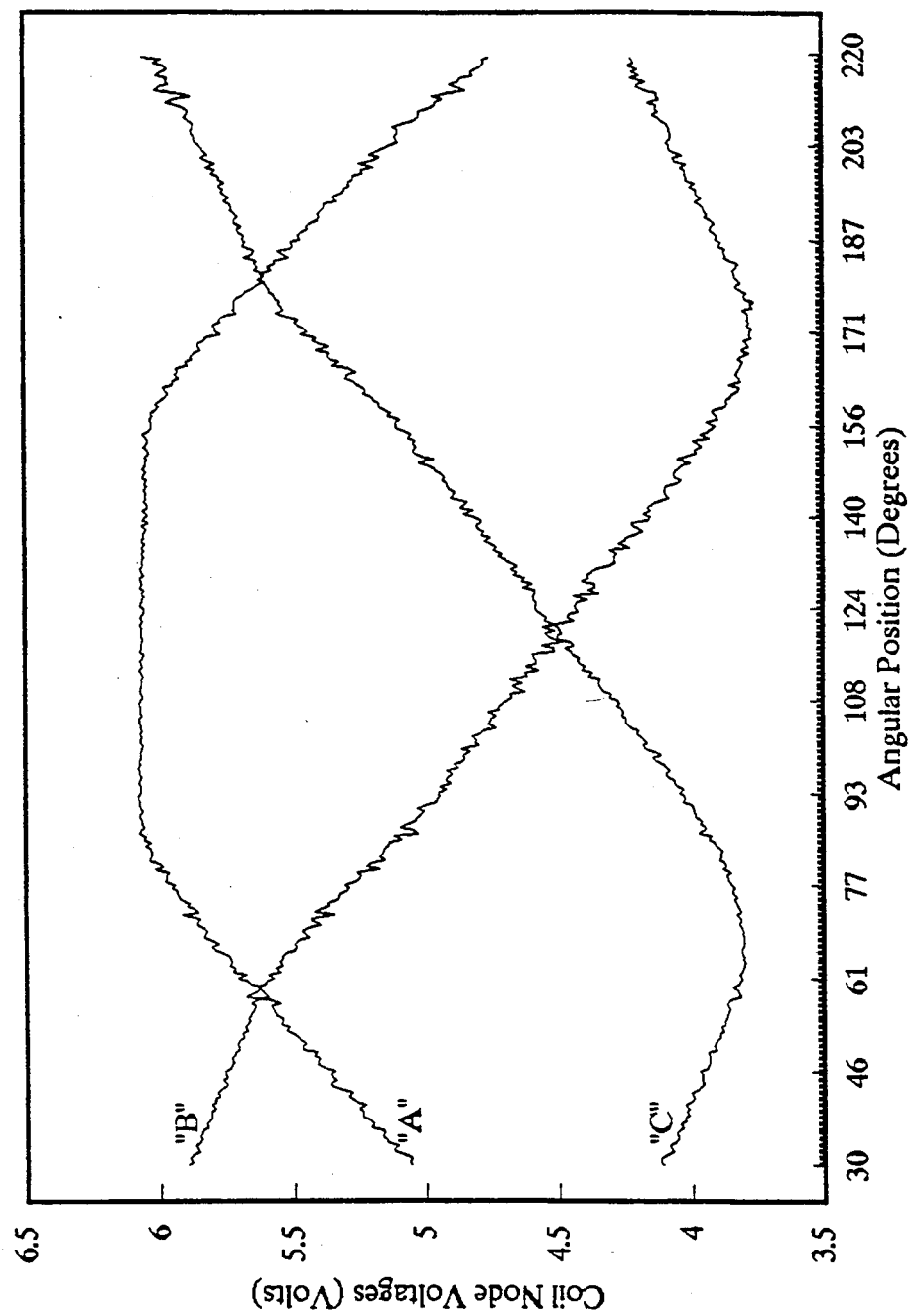
FIG. 26 is a graphical illustration of coil node voltages for use with the coil drive system shown in FIG. 25.

Referring now to FIG. 25, there is illustrated a block diagram for an alternative piece-wise linear 3-coil motor drive system, shown generally by reference numeral 380. The embodiment is shown for use with a motor utilized in a engine speed gauge of a vehicular instrument cluster. In this embodiment, an input signal, such as from an engine speed sensor (not specifically illustrated), is provided to the signal processing circuitry shown generally by reference numeral 382, which processes by introducing a gain which varies according to the number of cylinders in the engine of the vehicle. This signal is generally indicative of the desired angular position of the pointer associated with the gauge (e.g. the gauge pointer should be located at 65 mph). This signal is then communicated to a waveform generator 384, such as an LM1819, commercially available from National Semiconductor, of Santa Clara, Calif., United States of America. The waveform generator functions as a converter from frequency to voltage, preferably generating sine and cosine waveforms. These sine and cosine waveforms are then processed by standard offset and gain circuitry, shown generally by reference numeral 386. Next, a "copy" of the sine waveform is communicated directly to the power amplifiers 392. A "copy" of the both the sine and cosine waveforms is processed by phase shifting circuitry shown generally by reference numeral 388 and combined prior to being communicated to an amplifier 392. Preferably, the phase shifting circuitry 388 multiplies the sine waveform by a first constant (i.e. −0.5) and multiplies the cosine waveform by a second constant (i.e. −0.866). Thus, the circuitry 388 functions to generate a phase shifted sine waveform (e.g. X+120°). The other "copy" of the waveform is processed by the phase shifting circuitry shown generally by reference numeral 390, which functions similarly to generate a second phase shifted sine waveform (e.g. X+240°). Thus, three 120° phase shifted waveforms are communicated to the power amplifiers 392, which amplify the waveforms for application to the coil nodes A, B and C formed by the electrical interconnection of the coils 218. FIG. 26 illustrates sample coil drive voltage waveforms, plotted versus angular position, generated by the coil drive system shown in FIG. 25. As shown on the horizontal axis, only approximately 190° of the waveforms generated by the waveform generator 384 are graphed. However, the circuit has the capability to produce a full 360° of rotation. Since the waveform generator 384 only generates approximations of sine and cosine waves, some inaccuracies, such as the plateau on the voltage waveform for node "A", are to be expected. Such inaccuracies do not, however, significantly affect positioning accuracy.

Figure 27:
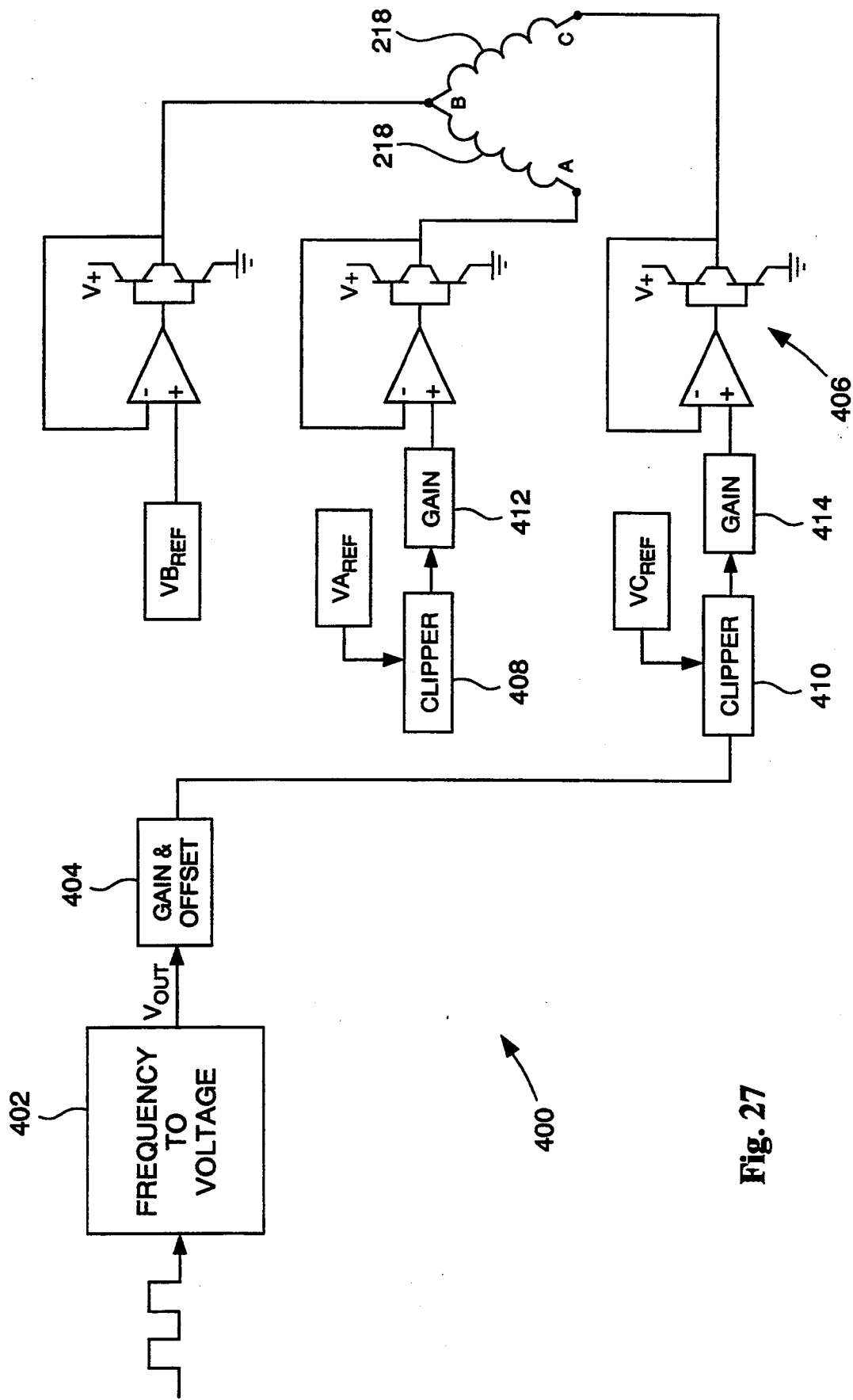
FIG. 27 is a schematic block diagram of an alternative 2-coil drive system for use with a motor constructed in accordance with the present invention.
Figure 28:
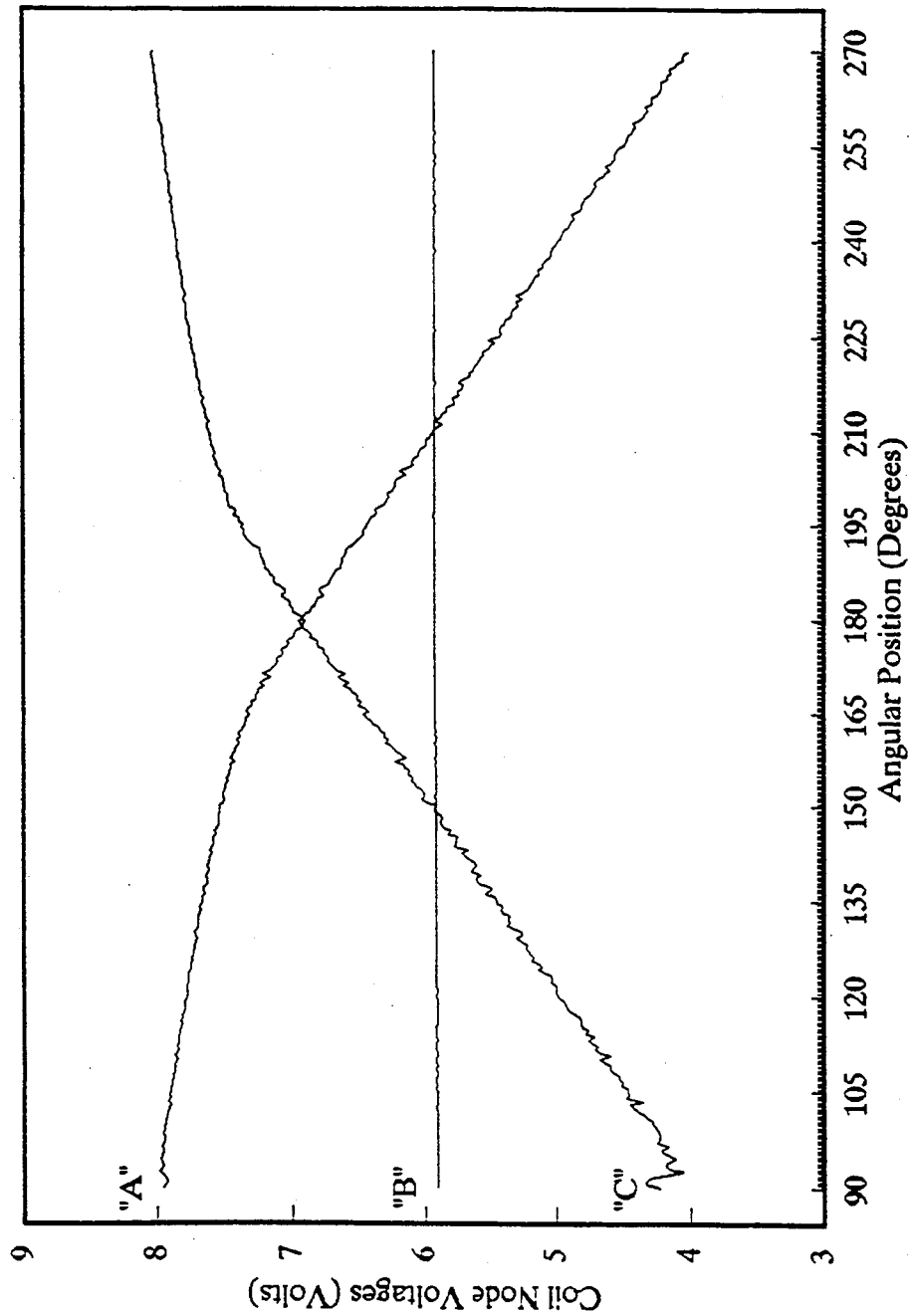
FIG. 28 is a graphical illustration of coil node voltages for use with the coil drive system shown in FIG. 27.

Referring now to FIG. 27, there is shown a block diagram for an alternative piece-wise linear 2-coil motor drive system, shown generally by reference numeral 400. As illustrated, the 2-coil drive system 400 includes a frequency-to-voltage converter 402, offset and gain circuitry shown generally by 404 and a transistor power stage shown generally by 406 including a plurality operational amplifiers and transistors. In this embodiment, an input signal, such as from an engine speed sensor (not specifically illustrated), is provided to the frequency-to-voltage converter circuitry 402, such as an LM2917, commercially available from National Semiconductor, of Santa Clara, Calif., United States of America, which outputs an analog voltage signal. The analog voltage signal is then processed by standard offset and gain circuitry 404, which outputs a generally linear ramp to the clipper circuits 408 and 410 of the transistor power stage. Clipper circuit 408 is also provided with a reference voltage ($VA_{ref}$), which represents the voltage level the clipper circuit 408 clips the linear ramp. The output of the clipper circuit 408 is communicated to negative gain circuitry 412, which functions to invert the clipped linear ramp. The output of the gain circuitry 412 is then communicated to the associated operational amplifier/transistor for application to the coil node "A". The drive voltage for node "C" is generated with substantially similar circuitry, except that positive gain circuitry 414 utilized (i.e. the clipped ramp is not inverted). Typical coil drive voltages for nodes "A" and "C" are illustrated in FIG. 28. Since there are only two coils, node "B" is maintained at a positive bias voltage level, as illustrated in FIG. 28.

As the drive voltages for nodes "A" and "C" swing, node "B" operates to both source and sink current. For example, with reference to FIG. 28, at an angular position of approximately 120°, it can be seen that coil node voltage "A">coil node voltage "B">coil node voltage "C". Thus, node "B" acts as a current sink for the current flowing from "A" and a current source for current flowing to node "C". However, at an angular position of approximately 225°, coil node voltage "C">coil node voltage "B">coil node voltage "A". Thus, node "B" acts as a current sink for the current flowing from node "C" and a current source for current flowing to node "A".

Figure 29:
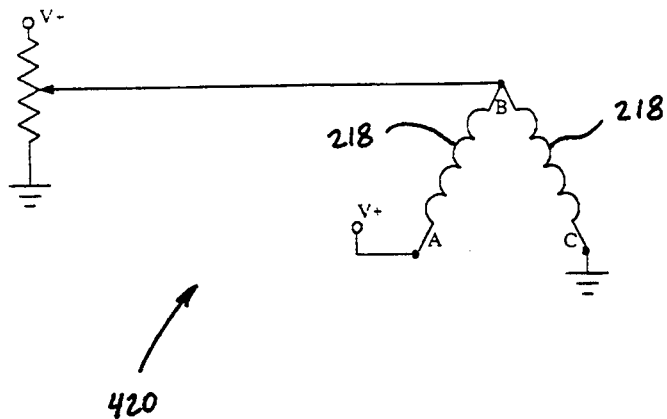
FIG. 29 is a schematic diagram for a basic passive coil drive system for use with a motor constructed in accordance with the present invention.
Figure 30:
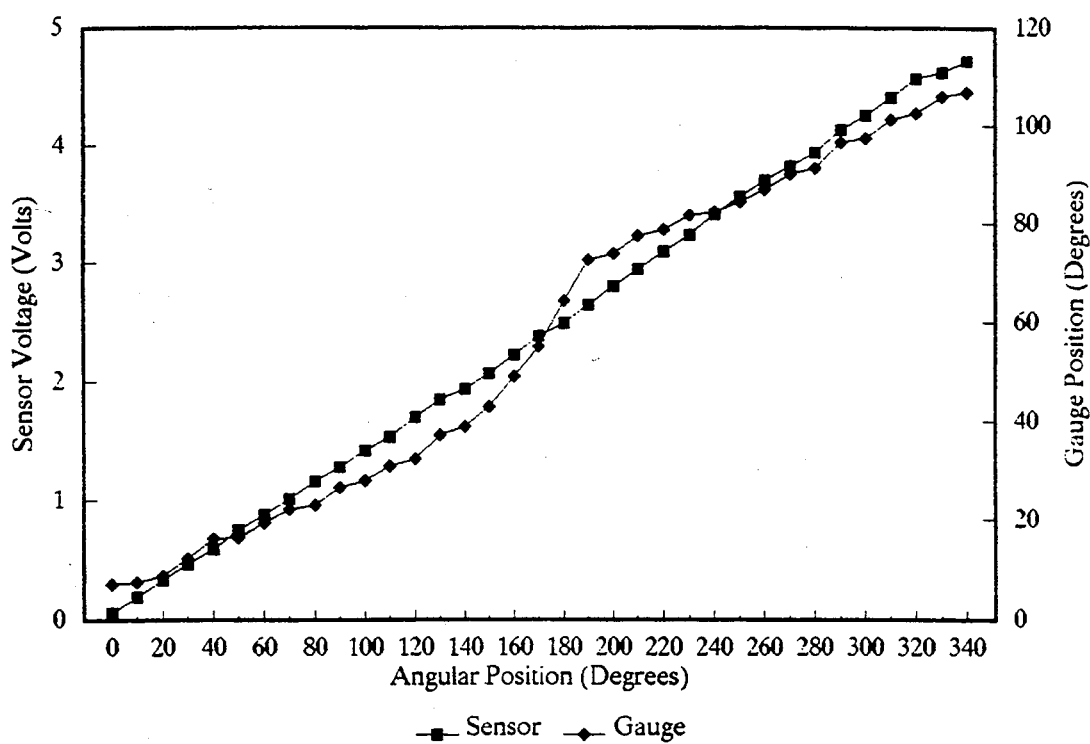
FIG. 30 is a graphical representation of the relationship between sensor voltage and corresponding gauge position (°) for the drive system shown in FIG. 29.

Referring now to FIG. 29, there is illustrated a schematic diagram for a basic passive coil drive system, shown generally by reference numeral 420. In this embodiment, an analog voltage signal is generated, such as by a fuel level sensor. As illustrated, this analog voltage signal is then communicated to coil node "B" to set up a reference voltage level at node "B". Preferably, coil node "A" is electrically connected to a voltage source (V+) and coil node "C" is electrically connected to a ground potential. Thus, current (i) flows in the direction indicated by the arrows. It should be appreciated that such a drive system is inexpensive and provides for approximately 120° of rotation. FIG. 30 is a graphical representation of the relationship between sensor voltage (i.e. voltage at node "B") and corresponding gauge position (°). As shown, there is generally a linear relationship between sensor voltage and gauge position.

Figure 31:
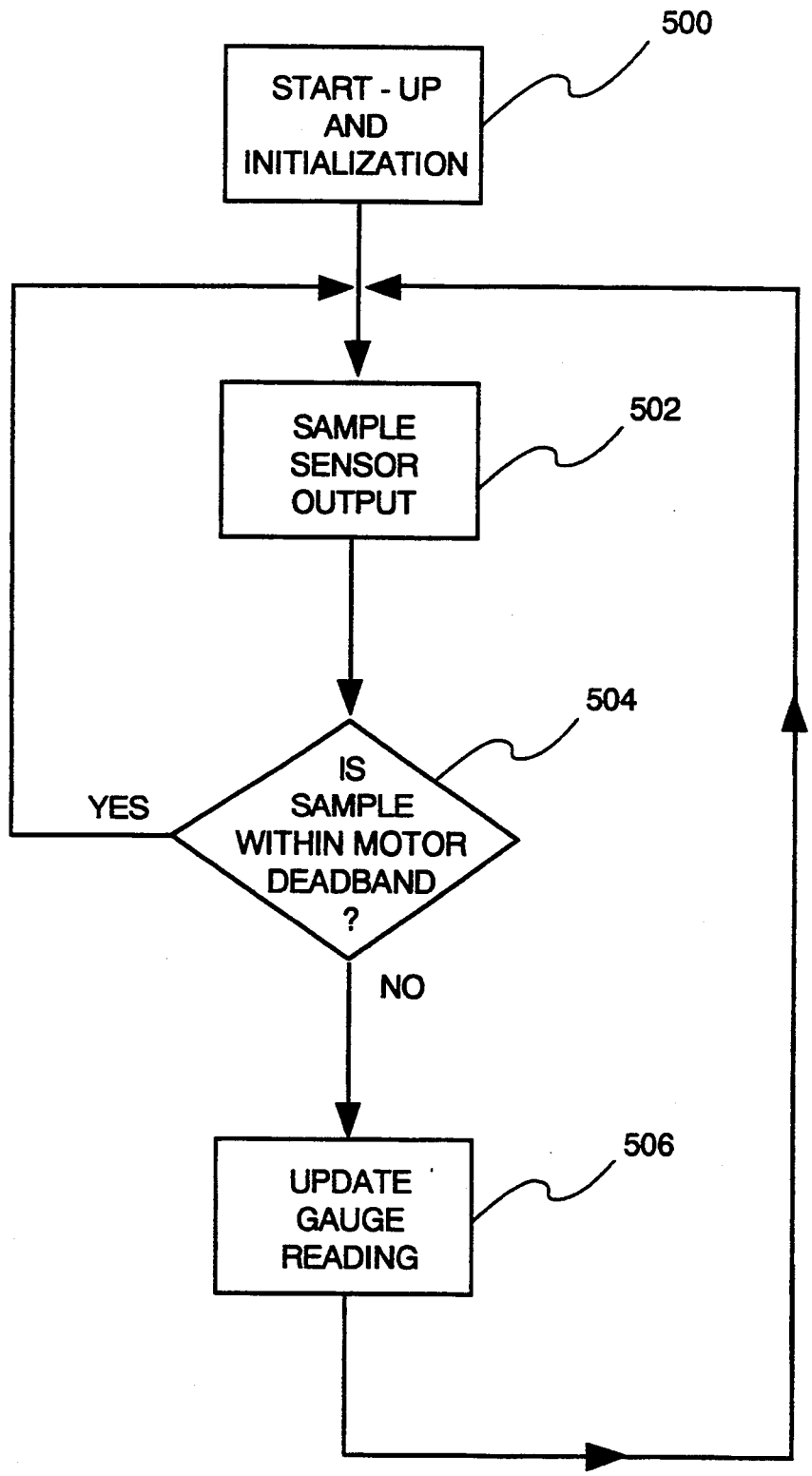
FIG. 31 is a flow chart illustrating the main control logic flow for use with the present invention.

Referring now to FIG. 31, a flow chart illustrates the program flow for use with the microprocessor-based drive system 340 shown in FIG. 23. At step 500, the microprocessor (μP) 342 enters a start-up and initialization phase, which includes resetting variables, checking memory, and the like. At step 502, the μP 342 reads sensor output, and program flow is transferred to the "Sample Sensor Output" subroutine shown in FIG. 32.

Figure 32:
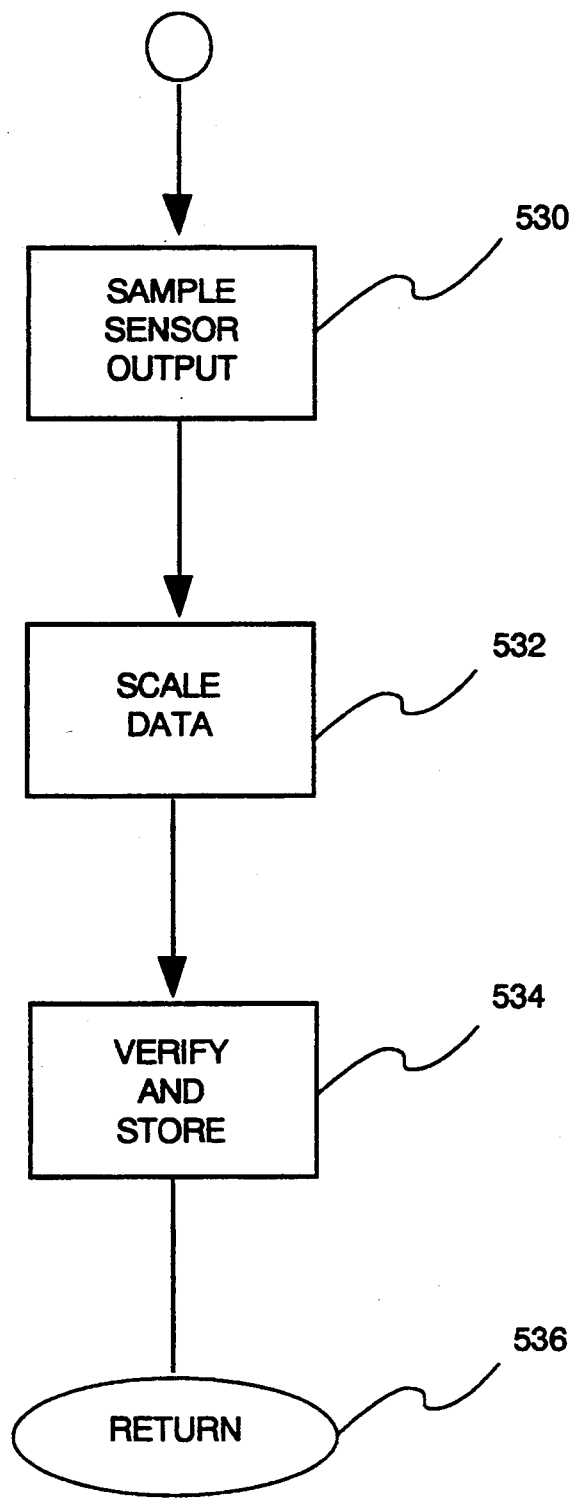
FIG. 32 is a flow chart illustrating the logic flow of a subroutine of the main control shown in FIG. 31.

As shown in FIG. 32, at step 530 the μP 342 acquires output from sensors, such as an engine speed sensor. If the sensor output is analog, an internal A/D converts the output into digital format for further processing. Due to the differences in the type of sensors that could be providing data to the μP 342, sensor output can vary drastically in magnitude. For the most accurate processing, therefore, the digitized sensor output is scaled at step 532.

The scaled data is then verified and stored in an internal volatile memory element or random-access memory (RAM) of the μP 342 at step 534. Data verification insures detection of sensor deterioration and/or failure. At step 536, program flow is returned to the main program shown in FIG. 31.

Figure 33:
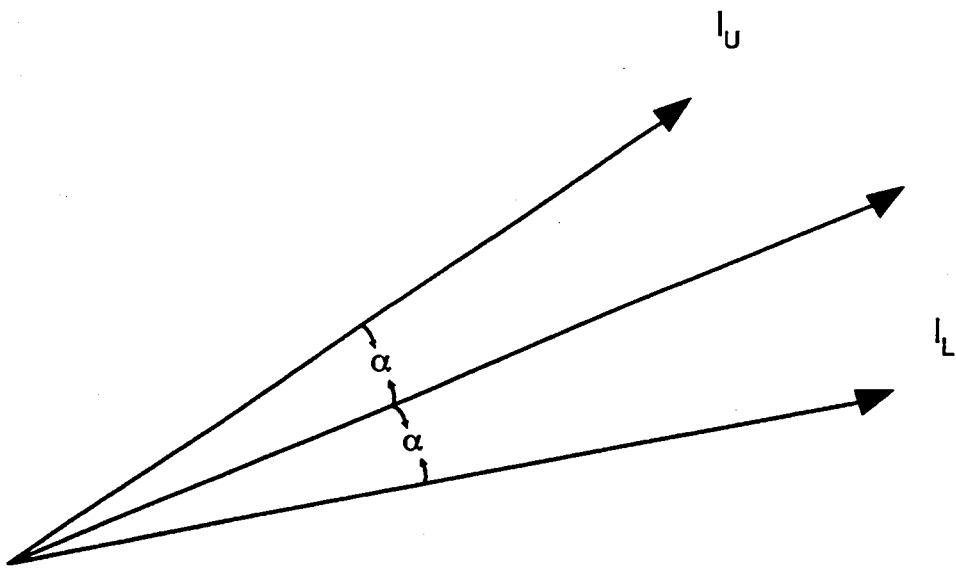
FIG. 33 is a graphical illustration of the deadband of the motor.

As shown in FIG. 31, at step 504 the μP 342 determines if the scaled sensor output is within a deadband of the motor 200. The deadband represents the required minimum change in angular position of the motor 200 and is illustrated graphically in FIG. 33. Preferably, the new angular position of the motor 200 is outside of the upper limit $l_u$ or the lower limit $l_l$ (i.e. move through an angle of a°) before the μP 342 will energize the coils 218 and update its gauge position. The μP 342 first determines the numerical difference between the scaled sensor output and the scaled data value representing the current angular position of the motor 200. If this difference would translate to a change in angular position exceeding the deadband, the pointer position is updated.

Figure 34:
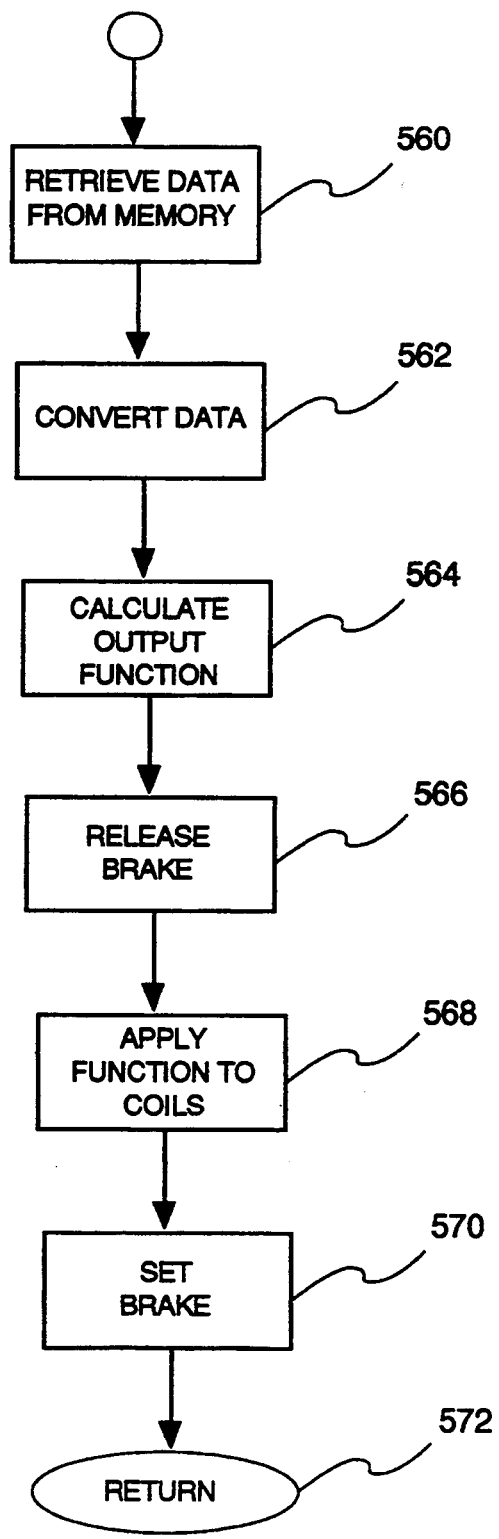
FIG. 34 is a flow chart illustrating the logic flow of another subroutine of the main control shown in FIG. 31.

At step 506, program flow is transferred to the "Update Gauge Reading" subroutine shown in FIG. 34. The scaled data is retrieved from the RAM memory at step 560. At step 562, the data is then converted to a value representative of a corresponding desired motor angular position. For example, the sensor reading may correspond to a new speed of which is converted to an angular position of X°, as indicated on the graph. The μP 342 then performs a data table look-up of data stored in a read-only memory (ROM), not specifically illustrated, utilizing the desired motor angular position data. The ROM preferably contains a table containing data representing drive voltages for the coils 218. Generally, every angular position of motor 200 can be characterized by a unique set of coil voltages, as previously shown in FIG. 14.

With continuing reference to FIG. 34, at step 564 the μP 342 utilizes the set of data voltages to calculate the output function to be applied to each of the coils 218. Prior to applying the output function (i.e. the drive voltages) to the coils 218, the μP 342 energizes the piezoelectric brake 246 (shown in FIG. 11) at step 566. As previously described, this deflects the brake flat, thereby releasing the rotor assembly 230, allowing the motor output shaft 238 to rotate.

Figure 35:
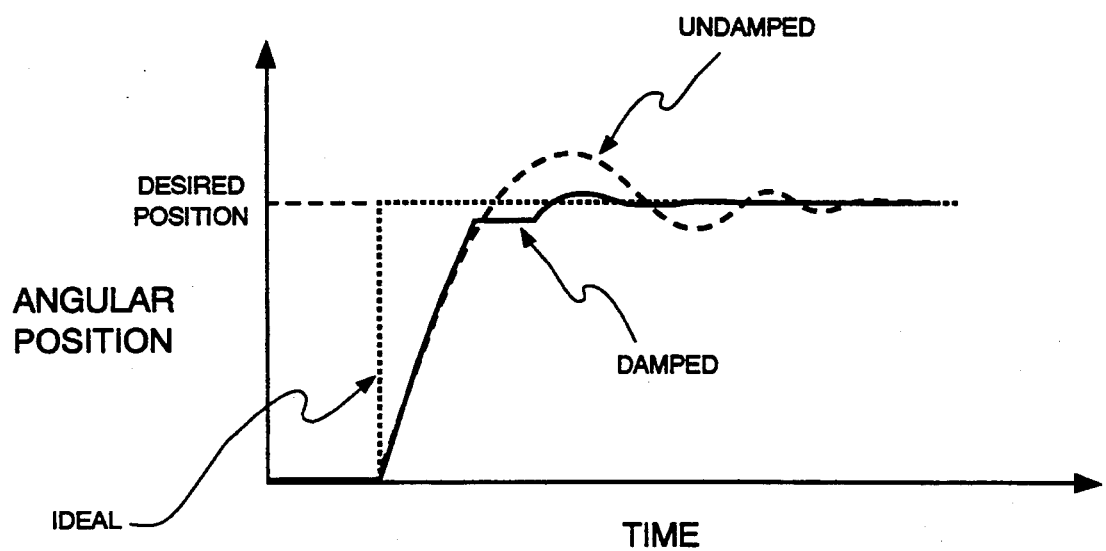
FIG. 35 is a graphical illustration of ideal, undamped and damped motor responses plotted versus time.

At step 568, the μP 342 energizes the coils 218 according to the output function. The output shaft 238 then rotates to the desired angular position. At step 570, the μP 342 removes power from the piezoelectric brake 246. The brake 246 thus returns to its concave shape and is set against the rotor assembly 230, thereby preventing further rotation. The use of the piezoelectric brake 246 may allow for the precise control of the response of the motor 200 to an output function. FIG. 35 illustrates the relationship between an ideal motor response (i.e. a step response), a damped motor response and an undamped motor response over time. Specifically, various levels of brake application during shaft rotation may minimize overshoot and fix the angular position quickly and accurately.

It is understood, of course, that while the forms of the invention herein shown and described constitute the preferred embodiments of the invention, they are not intended to illustrate all possible forms thereof.

For example, a position feedback signal related to the position of the load can be generated by energizing one of the coils 218, such as in the delta connection of FIG. 12A, and sensing any resulting current or voltage appearing across one or both of the other coils.

It will also be understood that the words used are words of description rather than limitation, and that various changes may be made without departing from the spirit and scope of the invention as disclosed.

What is claimed is:

1. An instrument panel for use in a passenger vehicle to provide a visual representation of data from a plurality of instruments to a passenger, the instrument panel comprising:

a thin generally planar light distribution layer having a front surface, a back surface, an outer peripheral edge, and a plurality apertures extending through said light distribution layer between said front and back surfaces, with each of said of said apertures being defined by an inner peripheral edge;

a light source cooperating with at least a portion of one of said peripheral edges of the light distribution layer for directing light into the plane thereof;

a graphic layer having indicia thereon forming a stationary graphic portion of a plurality of analog gauges, said graphic layer overlaying the front surface of the light distribution layer;

a circuit board fixed relative to said light distribution layer and extending parallel and adjacent to the back surface thereof, said circuit board having mounted thereon a series of electrical components and a plurality of electric gauge motors forming a portion of said plurality of analog gauges, each of said gauge motors having a stator mounted in fixed relation to the circuit board and a rotor and shaft assembly rotatable relative thereto about an axis generally perpendicular to the plane of the light distribution layer, each of said plurality of gauge motor shafts being aligned with one of said plurality of apertures in said light distribution layer; and a plurality of rotatable masks each mounted adjacent to said graphic layer and affixed to the rotor and shaft assembly through one of said apertures in the light distribution layer, said masks each rotatably shiftable relative to the indicia on the graphic layer to form an analog gauge for transmitting instrument data to a vehicle passenger.

2. The instrument panel of claim 1 wherein said gauge motor shaft is of sufficient length to extend from the circuit board completely through the light distribution and graphic layers.

3. The instrument panel of claim 2 wherein the light distribution layer is formed of a plastic sheet.

4. The instrument panel of claim 3 wherein the plastic sheet is locally treated to cause light to escape from the sheet front surface in the region of the indicia printed on the graphic layer.

5. The instrument panel of claim 1 wherein said light source comprises a vacuum fluorescent light.

6. The instrument panel of claim 1 wherein said light distribution layer comprises a plastic sheet having a portion of its peripheral edges defining an angled region inclined approximately 45 degrees relative to the plane of the light distribution layer forming a reflector, and said light source being affixed to said circuit board adjacent to said reflector.

7. The instrument panel of claim 6 wherein the plastic sheet forming the light distribution layer has a channel formed therein in order to control light distribution within the plane of the sheet.

8. The instrument panel of claim 1 wherein said light source comprises a vacuum fluorescent light having a first region providing light to the light distribution layer and a second region providing instrument data directly viewable by the vehicle passenger.

9. The instrument panel of claim 1 wherein said light distribution layer has formed therein an angled face region adjacent each of the apertures which cooperate with the plurality of analog gauges, said angled faces being inclined approximately 45 degrees relative to the plane of the light distribution layer to direct light within the light distribution layer perpendicularly through the front surface to illuminate the adjacent rotatable mask.

10. The instrument panel of claim 9 wherein said angled face region adjacent each of the apertures forms a truncated frusto-conical section.

11. The instrument panel of claim 1 further comprising a reflector cooperating with the outer peripheral edge of the light distribution layer to minimize light loss.

12. The instrument panel of claim 11 wherein said reflector comprises a metallic foil strip bonded to the peripheral edge of the light distribution layer.

13. The instrument panel of claim 7 wherein said channel is cut into said plastic sheet forming a narrow aperture extending through the sheet with a smooth reflective peripheral edge surface.

14. The instrument panel of claim 13 wherein at least a portion of the peripheral edges of said plastic sheet are cut using a laser thereby forming a relatively smooth reflective surface.

15. The instrument panel of claim 1 further comprising:
a housing surrounding the outer periphery of said light distribution layer and said circuit board, including means for removable attachment to a passenger vehicle; and
a clear plastic front panel affixed to said housing in spaced relation to said graphic layer, creating a thin instrument panel assembly without the need for a complex rear case for supplemental lighting, wherein said assembly is removably installable in a passenger vehicle.

16. An instrument panel for use in a passenger vehicle to provide a visual representation of data from a plurality of instruments to a passenger, the instrument panel comprising:
a thin generally planar plastic sheet forming a light distribution layer having a front surface, a back surface, an outer peripheral edge, and a plurality apertures extending through said light distribution layer between said front and back surfaces, with each of said of said apertures being defined by an inner peripheral edge;
a graphic layer having indicia thereon forming a stationary graphic portion of a plurality of analog gauges, said graphic layer overlaying the front surface of the light distribution layer;
a circuit board fixed relative to said light distribution layer and extending parallel and adjacent to the back surface thereof, said circuit board having mounted thereon a series of electrical components forming a gauge circuit and a plurality of miniature electric gauge motors forming a portion of said plurality of analog gauges, each of said miniature gauge motors having a stator mounted directly on the circuit board in electrical communication with said gauge circuit, and a rotor and shaft assembly rotatable relative to the stator about an axis generally perpendicular to the plane of the light distribution layer, each of said plurality of gauge motor shafts being aligned with and extending through one of said plurality of apertures in said light distribution layer;
a light source mounted on the circuit board and cooperating with one of said peripheral edges of the light distribution layer for directing light into the plane thereof;
a reflector cooperating with the outer peripheral edge of the light distribution layer to minimize light loss; and
a plurality of rotatable pointers each mounted adjacent to said graphic layer and affixed to a rotor shaft, said rotatable pointers being shiftable relative to the indicia on the graphic layer to form an analog gauge for transmitting instrument data to a vehicle passenger.

17. The instrument panel of claim 16 further comprising:
a housing surrounding the outer periphery of said light distribution layer and said circuit board, including means for removable attachment to a passenger vehicle; and
a clear plastic front panel affixed to said housing in spaced relation to said graphic layer, creating a thin instrument panel assembly without the need for a complex rear case for supplemental lighting, wherein said assembly is removably installable in a passenger vehicle.

18. The instrument panel of claim 16 wherein said plastic sheet is acrylic.

19. The instrument panel of claim 16 wherein at least a portion of the peripheral edges of said plastic sheet are cut using a laser thereby forming a relatively smooth reflective surface.

20. The instrument panel of claim 16 wherein said reflector comprises a metallic foil strip bonded to the peripheral edge of the light distribution layer.

21. The instrument panel of claim 16 wherein said light source and said light distribution layer are the sole means for illuminating said plurality of analog gauges, thereby simplifying design changes to relocate the analog gauges within the instrument panel.

* * * * *